(12) United States Patent
Chen et al.

(10) Patent No.: US 12,557,339 B2
(45) Date of Patent: Feb. 17, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chun-Yuan Chen, Hsinchu (TW); Huan-Chieh Su, Changhua (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 444 days.

(21) Appl. No.: 18/099,236

(22) Filed: Jan. 19, 2023

(65) Prior Publication Data
US 2024/0120391 A1   Apr. 11, 2024

Related U.S. Application Data

(60) Provisional application No. 63/414,541, filed on Oct. 9, 2022.

(51) Int. Cl.
*H10D 64/23* (2025.01)
*H01L 23/528* (2006.01)
(Continued)

(52) U.S. Cl.
CPC ..... *H10D 30/6729* (2025.01); *H01L 23/5283* (2013.01); *H10D 30/0198* (2025.01);
(Continued)

(58) Field of Classification Search
CPC ... H10D 30/019–0197; H10D 30/0198; H10D 30/6729; H10D 30/01; H10D 30/014; H10D 30/024; H10D 30/0241; H10D 30/031; H10D 30/0321; H10D 30/0323; H10D 30/0327; H10D 30/501–509; H10D 30/43; H10D 30/47; H10D 30/62; H10D 30/6211; H10D 30/6217; H10D 30/6218; H10D 30/6219; H10D 30/6733; H10D 30/6734; H10D 30/6735; H10D 30/6748;
(Continued)

(56) References Cited

U.S. PATENT DOCUMENTS 9,209,247 B2   12/2015  Colinge et al.
9,236,267 B2    1/2016  De et al.
(Continued)

*Primary Examiner* — Lauren R Bell
(74) *Attorney, Agent, or Firm* — NZ Carr Law Office

(57) ABSTRACT

Embodiments of the present disclosure provide semiconductor device structures and methods of forming the same. The structure includes a first source/drain region disposed under a well portion, a second source/drain region disposed adjacent the first source/drain region, a dielectric material disposed between the first and second source/drain regions, and a conductive contact having a first portion disposed under the first source/drain region and a second portion disposed adjacent the first source/drain region. The second portion is disposed in the dielectric material. The structure further includes a conductive feature disposed in the dielectric material, and the conductive feature is electrically connected to the conductive contact. The conductive feature has a top surface that is substantially coplanar with a top surface of the well portion.

20 Claims, 29 Drawing Sheets

(51) Int. Cl.
  *H10D 30/00* (2025.01)
  *H10D 30/01* (2025.01)
  *H10D 30/43* (2025.01)
  *H10D 30/67* (2025.01)
  *H10D 62/10* (2025.01)
  *H10D 64/01* (2025.01)
  *H10D 84/85* (2025.01)

(52) U.S. Cl.
  CPC .......... *H10D 30/43* (2025.01); *H10D 30/501* (2025.01); *H10D 30/6735* (2025.01); *H10D 62/121* (2025.01); *H10D 64/01* (2025.01); *H10D 64/2565* (2025.01); *H10D 84/85* (2025.01)

(58) Field of Classification Search
  CPC ... H10D 30/6757; H10D 64/254–2565; H10D 64/257; H01L 29/66439; H01L 29/401; H01L 29/41733; H01L 29/41766; H01L 29/775; H01L 29/78696; H01L 23/535; H01L 23/522; H01L 23/55283

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,672,665 B2* | 6/2020 | Chang ............... H10D 84/0135 |
| 2021/0399109 A1* | 12/2021 | Su ....................... H10D 62/121 |
| 2022/0139911 A1* | 5/2022 | Wei ..................... H01L 23/5226 257/365 |
| 2022/0367727 A1* | 11/2022 | Chang ................ H10D 30/6219 |
| 2023/0215767 A1* | 7/2023 | Xie ........................ H10D 30/43 257/329 |
| 2023/0275124 A1* | 8/2023 | Guler ................. H10D 30/0198 257/288 |
| 2023/0282722 A1* | 9/2023 | Frougier ............ H10D 84/0128 257/288 |
| 2023/0317566 A1* | 10/2023 | Fan ..................... H10D 62/364 |
| 2023/0378170 A1* | 11/2023 | Smith ................. H10D 84/038 |
| 2023/0402382 A1* | 12/2023 | Kim ..................... H01L 23/5286 |
| 2023/0402522 A1* | 12/2023 | Yu ........................ H10D 62/121 |

* cited by examiner

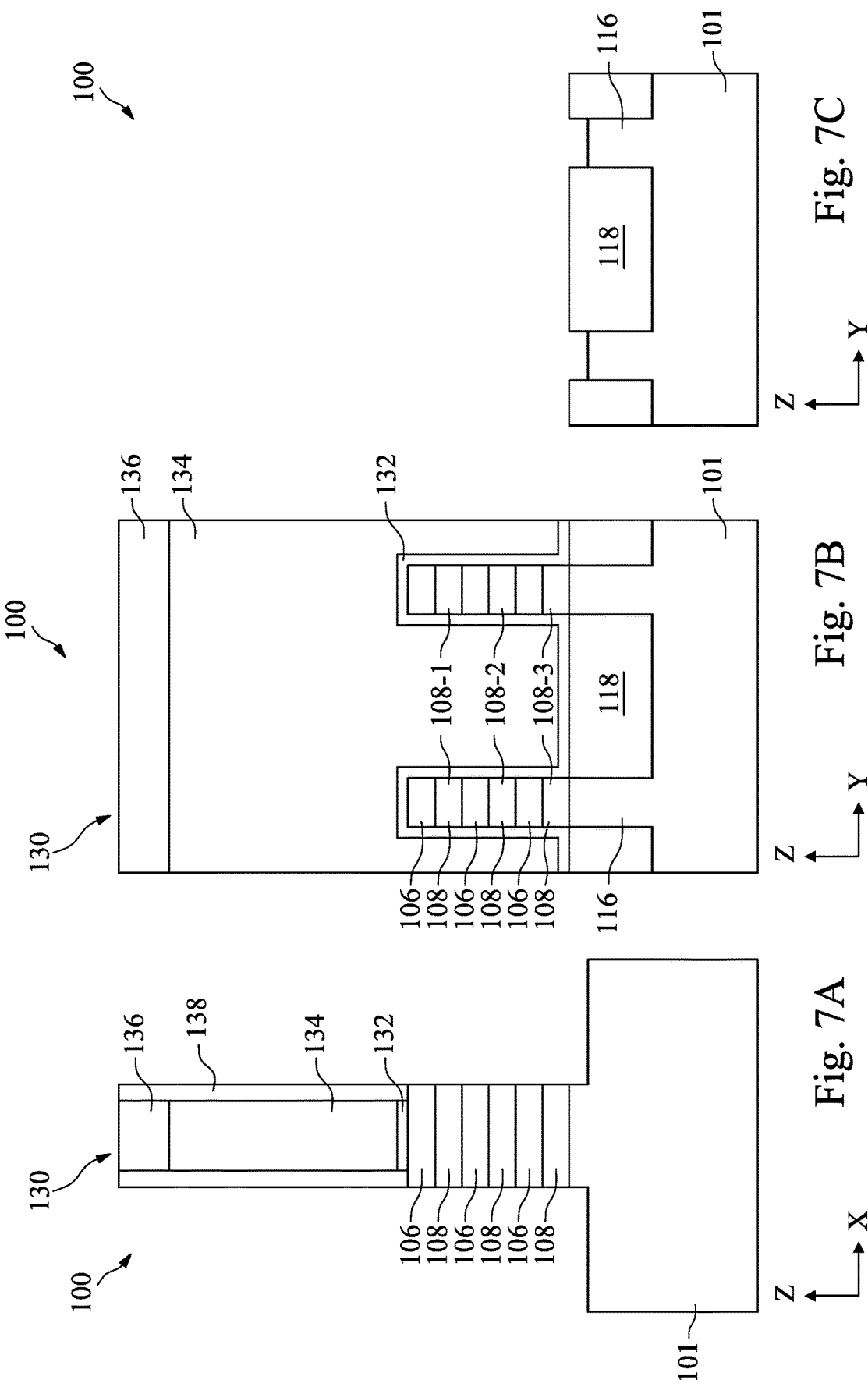

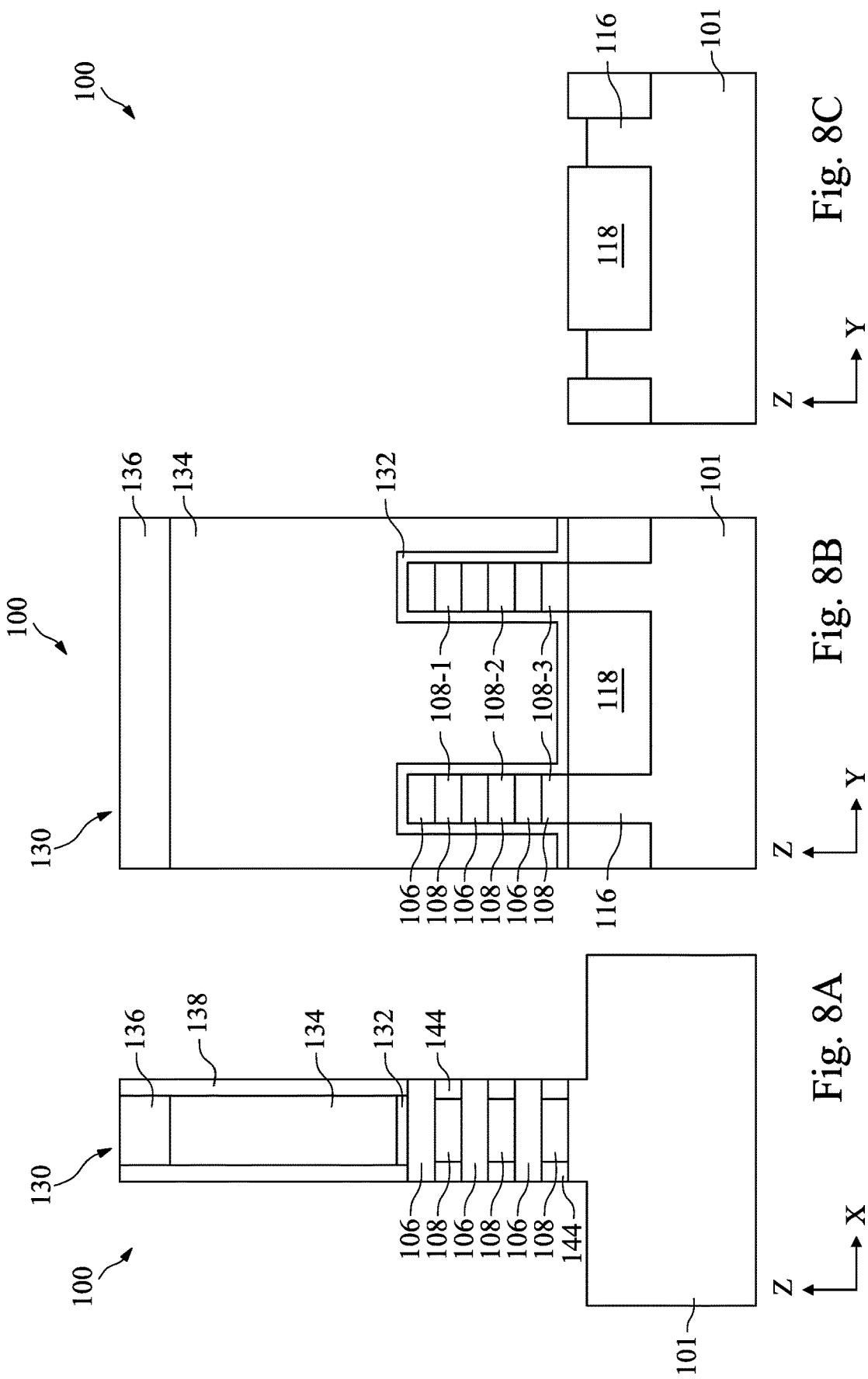

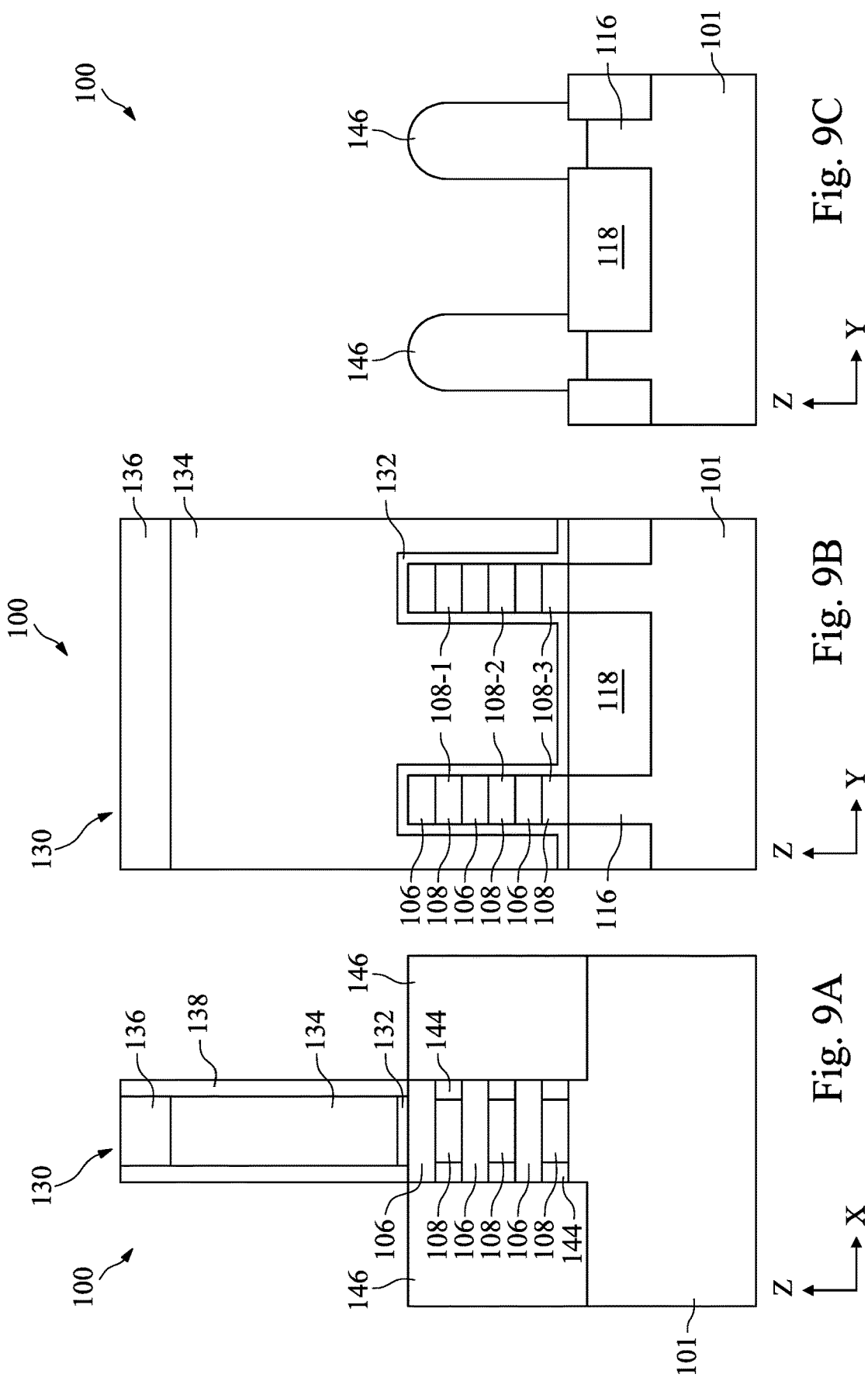

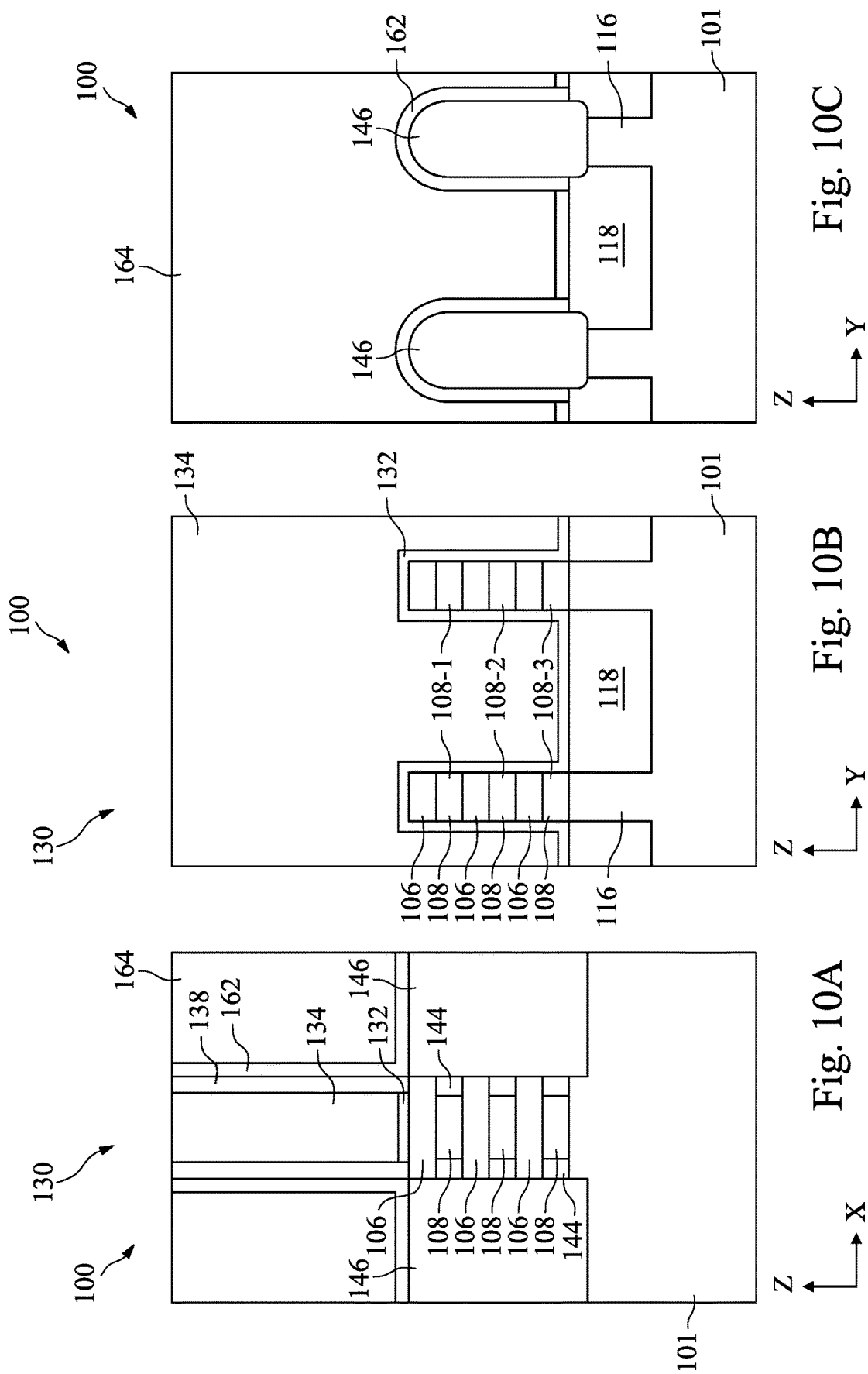

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/414,541 filed Oct. 9, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-11A are cross-sectional side views of various stages of manufacturing the semiconductor device structure taken along line A-A of FIG. 6, in accordance with some embodiments.

FIGS. 7B-11B are cross-sectional side views of various stages of manufacturing the semiconductor device structure taken along line B-B of FIG. 6, in accordance with some embodiments.

FIGS. 7C-11C are cross-sectional side views of various stages of manufacturing the semiconductor device structure taken along line C-C of FIG. 6, in accordance with some embodiments.

DETAILED DESCRIPTION

Figure 1:
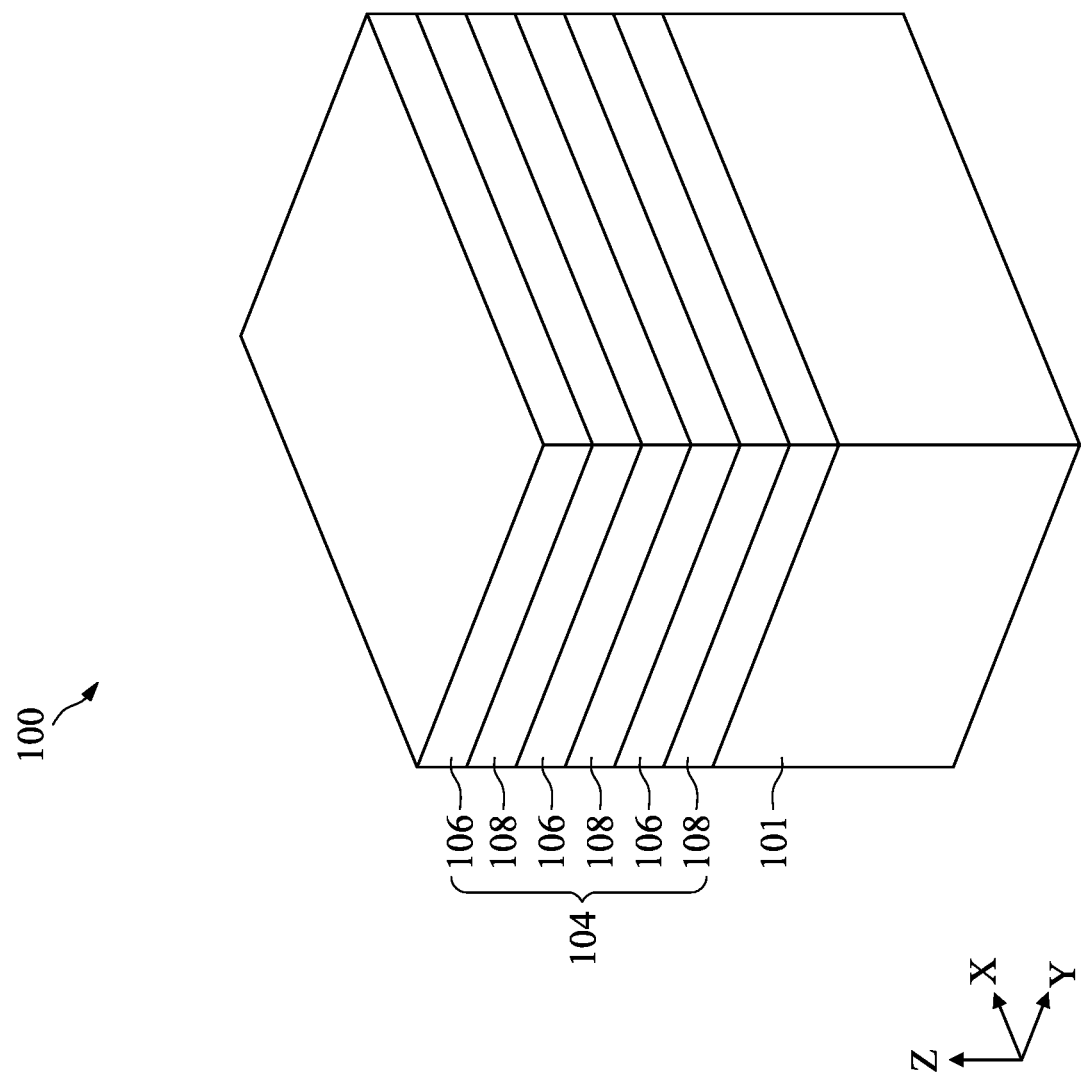
FIGS. 1-6 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures having power network moved from the front-side to the backside. As a result, the routing resource for both backside power and front-side signal is relaxed.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-29 show exemplary processes for manufacturing a semiconductor device structure 100 according to embodiments of the present disclosure. It is understood that additional operations can be provided before, during, and after processes shown by FIGS. 1-29, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
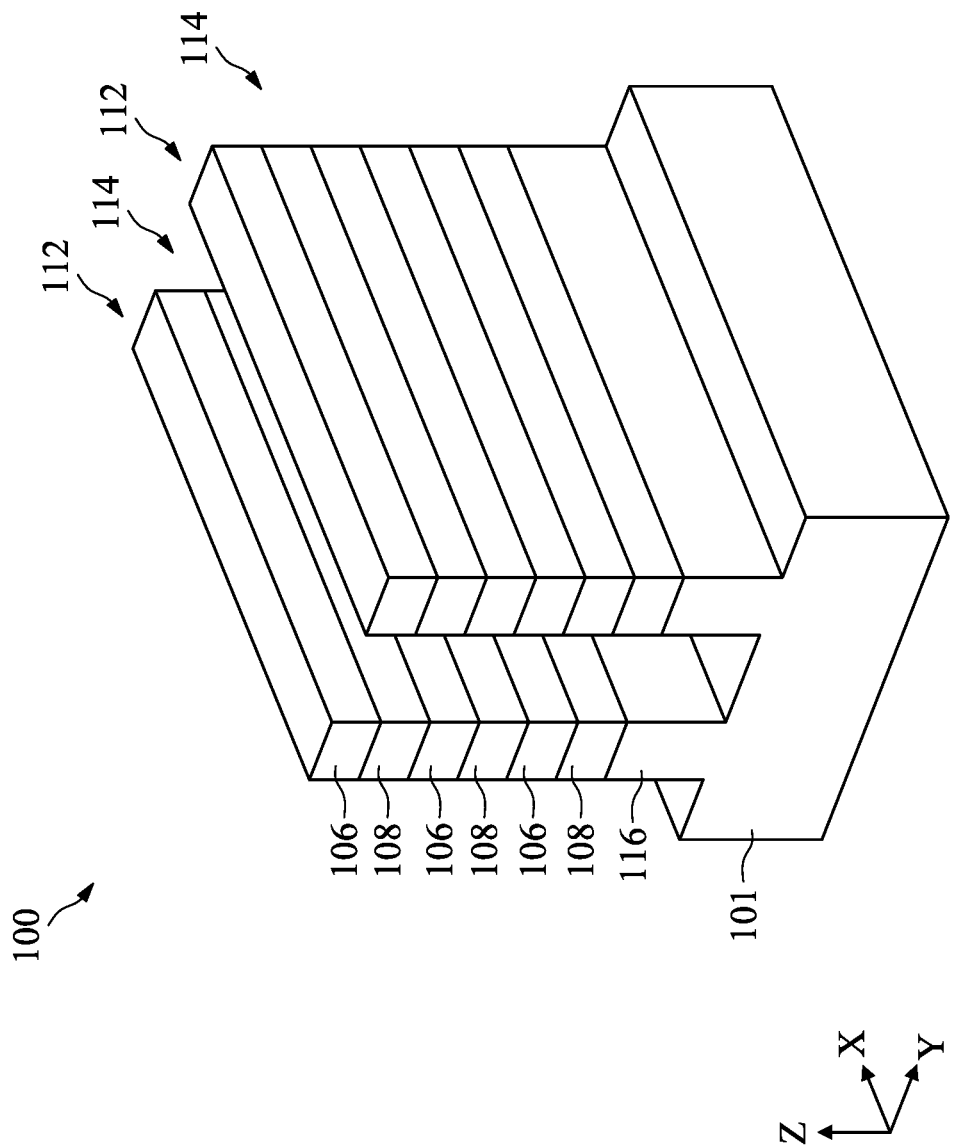

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
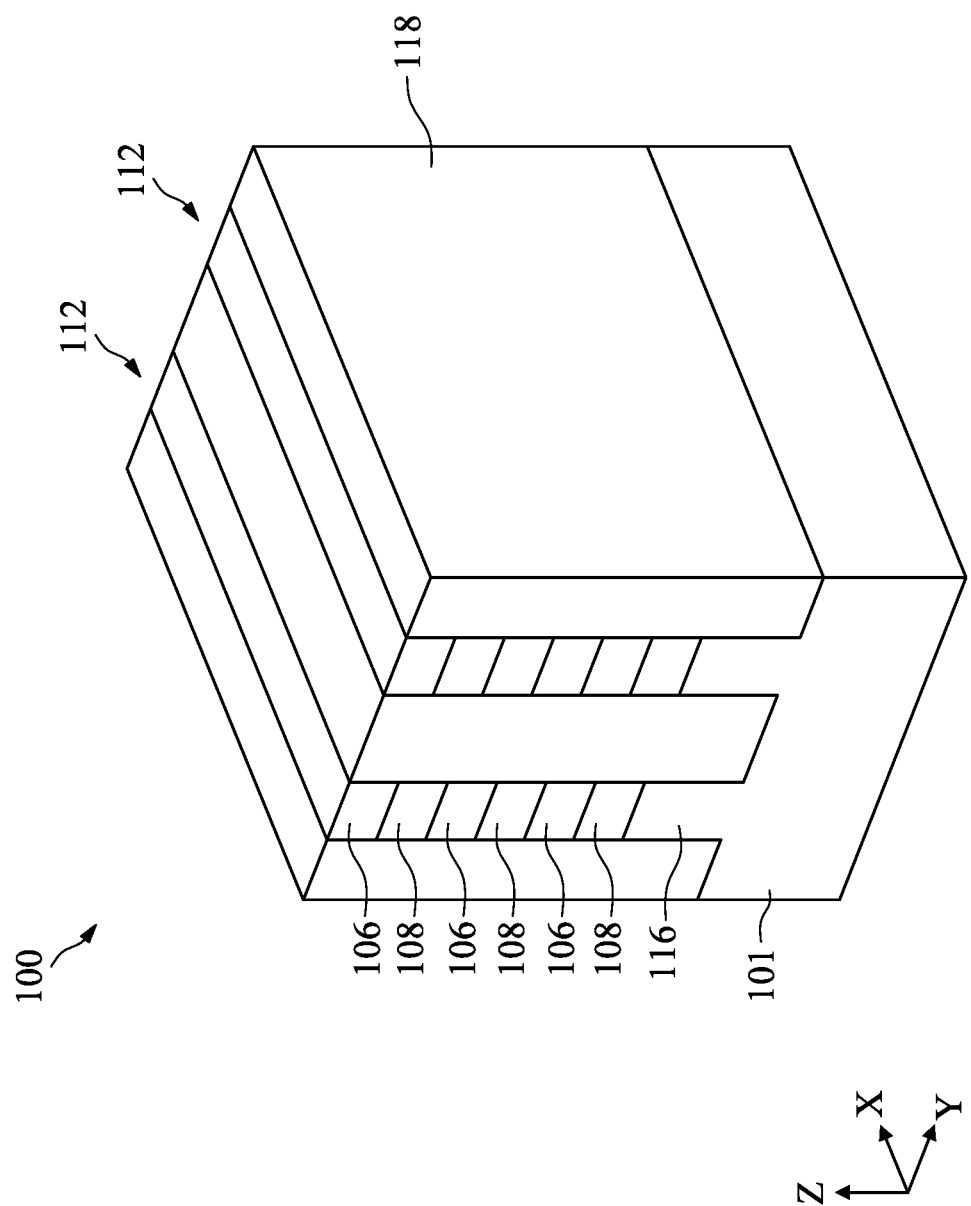

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
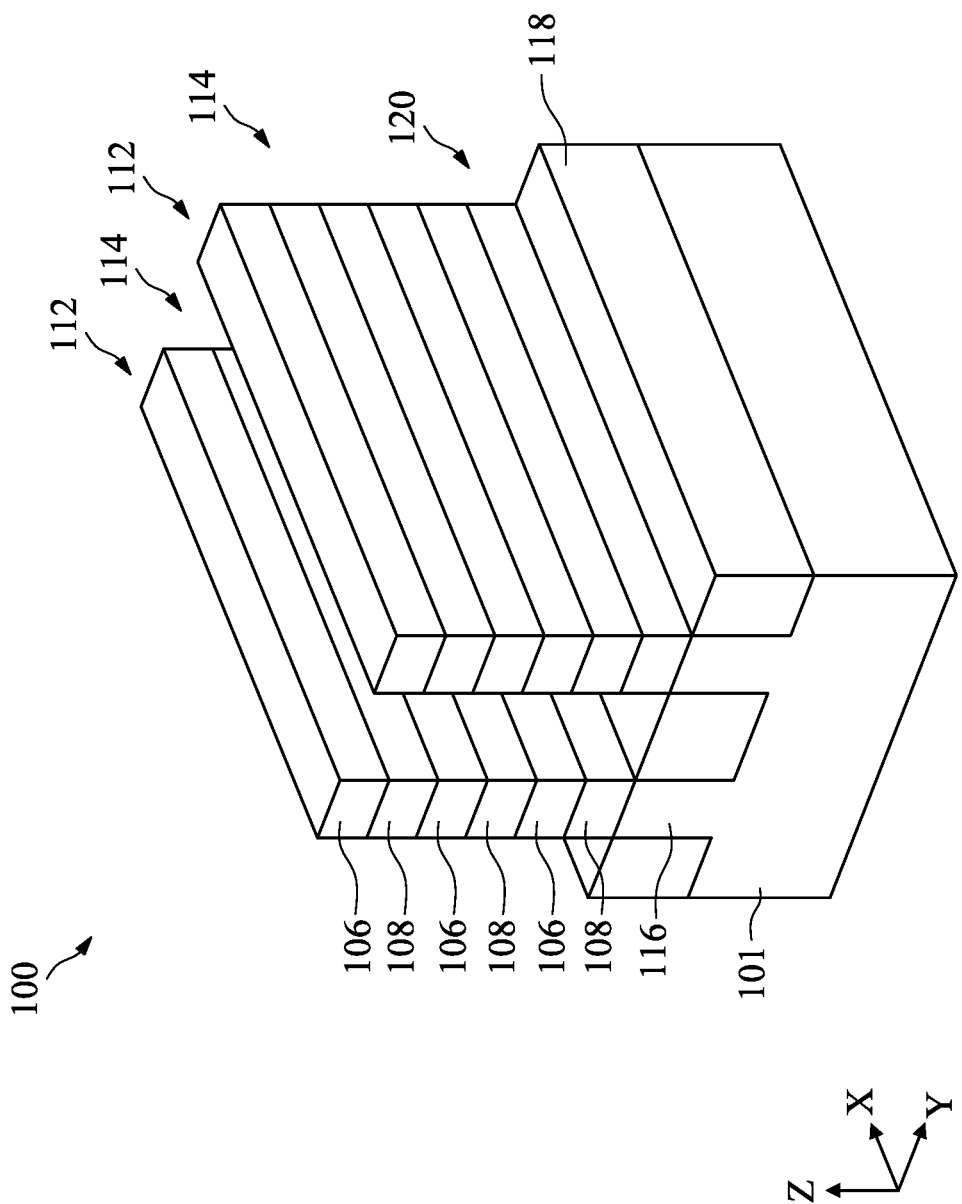

In FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
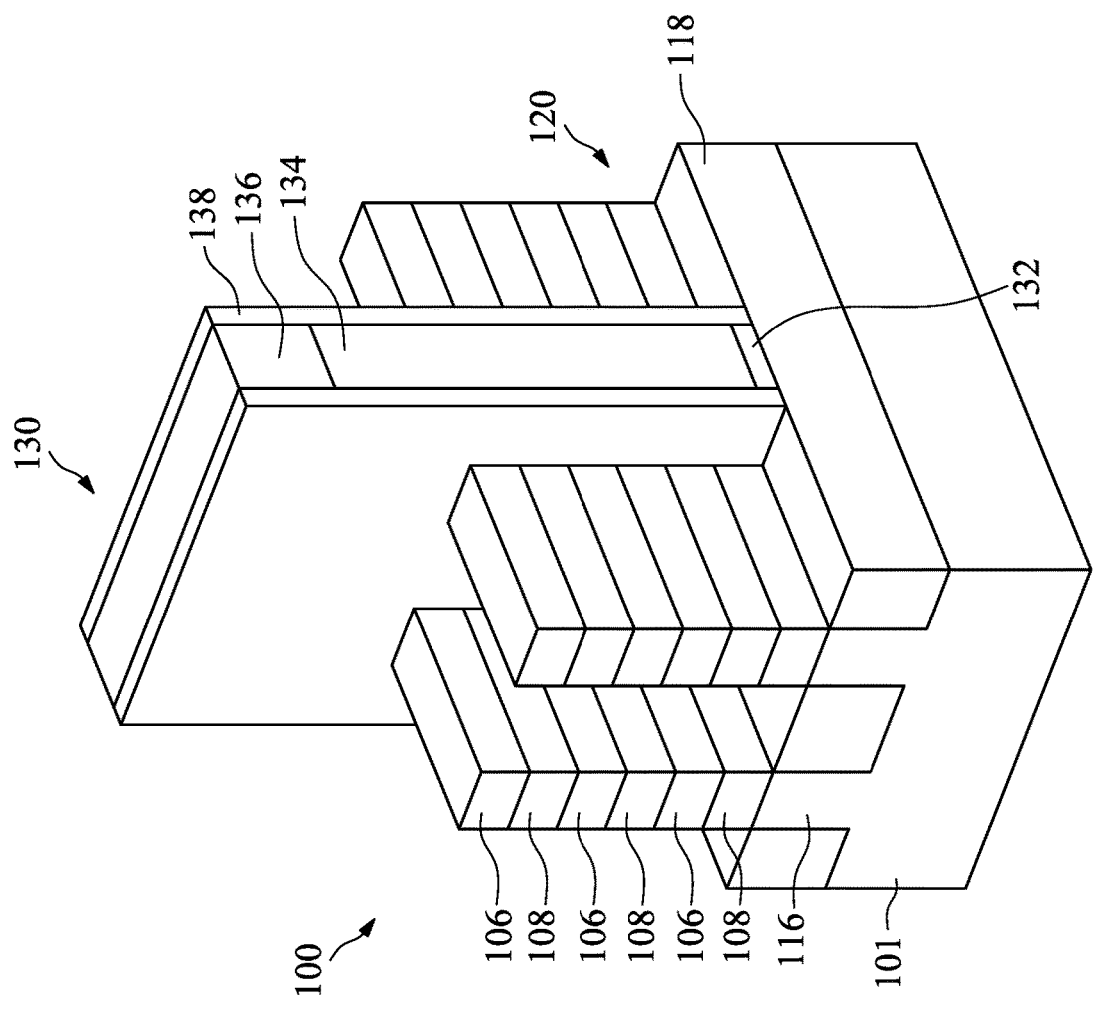

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100.

Figure 6:
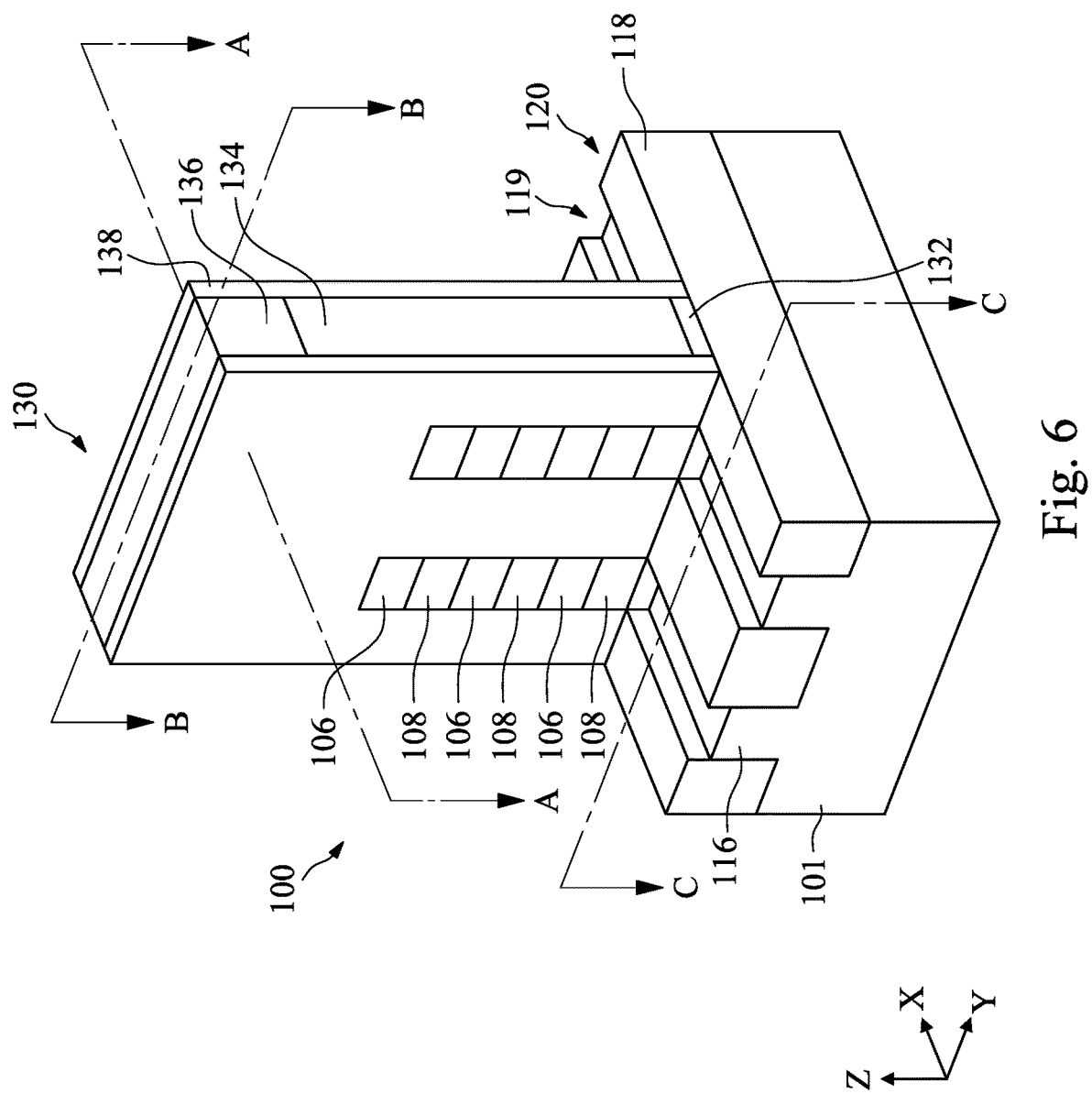

In FIG. 6, the portions of the fin structures 112 not covered by the sacrificial gate structure 130 and the gate spacers 138 are recessed to a level above, at, or below the top surfaces of the isolation regions 120. The recess of the portions of the fin structures 112 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethylammonium hydroxide (TMAH), ammonium hydroxide (NH$_4$OH), or any suitable etchant.

FIGS. 7A, 7B, and 7C are cross-sectional side views of the semiconductor device structure 100 taken along line A-A, line B-B, and line C-C of FIG. 6, respectively.

FIGS. 8A, 8B, and 8C are cross-sectional side views of one of various stages of manufacturing the semiconductor device structure 100 taken along line A-A, line B-B, and line C-C of FIG. 6, respectively, in accordance with some embodiments. As shown in FIG. 8A, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

FIGS. 9A, 9B, and 9C are cross-sectional side views of one of various stages of manufacturing the semiconductor device structure 100 taken along line A-A, line B-B, and line C-C of FIG. 6, respectively, in accordance with some embodiments. As shown in FIGS. 9A and 9C, source/drain (S/D) regions 146 are formed from the well portion 116. The S/D regions 146 may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. The S/D regions 146 may be made of one or more layers of Si, SiP, SiC and SiCP for n-channel FETs or Si, SiGe, Ge for p-channel FETs. For p-channel FETs, p-type dopants, such as boron (B), may also be included in the S/D regions 146. The S/D regions 146 may be formed by an epitaxial growth method using CVD, ALD or MBE.

FIGS. 10A, 10B, and 10C are cross-sectional side views of one of various stages of manufacturing the semiconductor device structure 100 taken along line A-A, line B-B, and line C-C of FIG. 6, respectively, in accordance with some embodiments. In FIGS. 10A, 10B, and 10C, a contact etch stop layer (CESL) 162 is conformally formed on the exposed surfaces of the semiconductor device structure 100. The CESL 162 covers the sidewalls of the sacrificial gate structure 130, the insulating material 118, and the S/D regions 146. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include compounds including Si, 0, C, and/or H, such as silicon oxide, SiCOH, or SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

After the ILD layer 164 is formed, a planarization operation, such as CMP, is performed on the semiconductor device structure 100 until the sacrificial gate electrode layer 134 is exposed, as shown in FIGS. 10A and 10B.

Figures 11A, 11B, 11C:
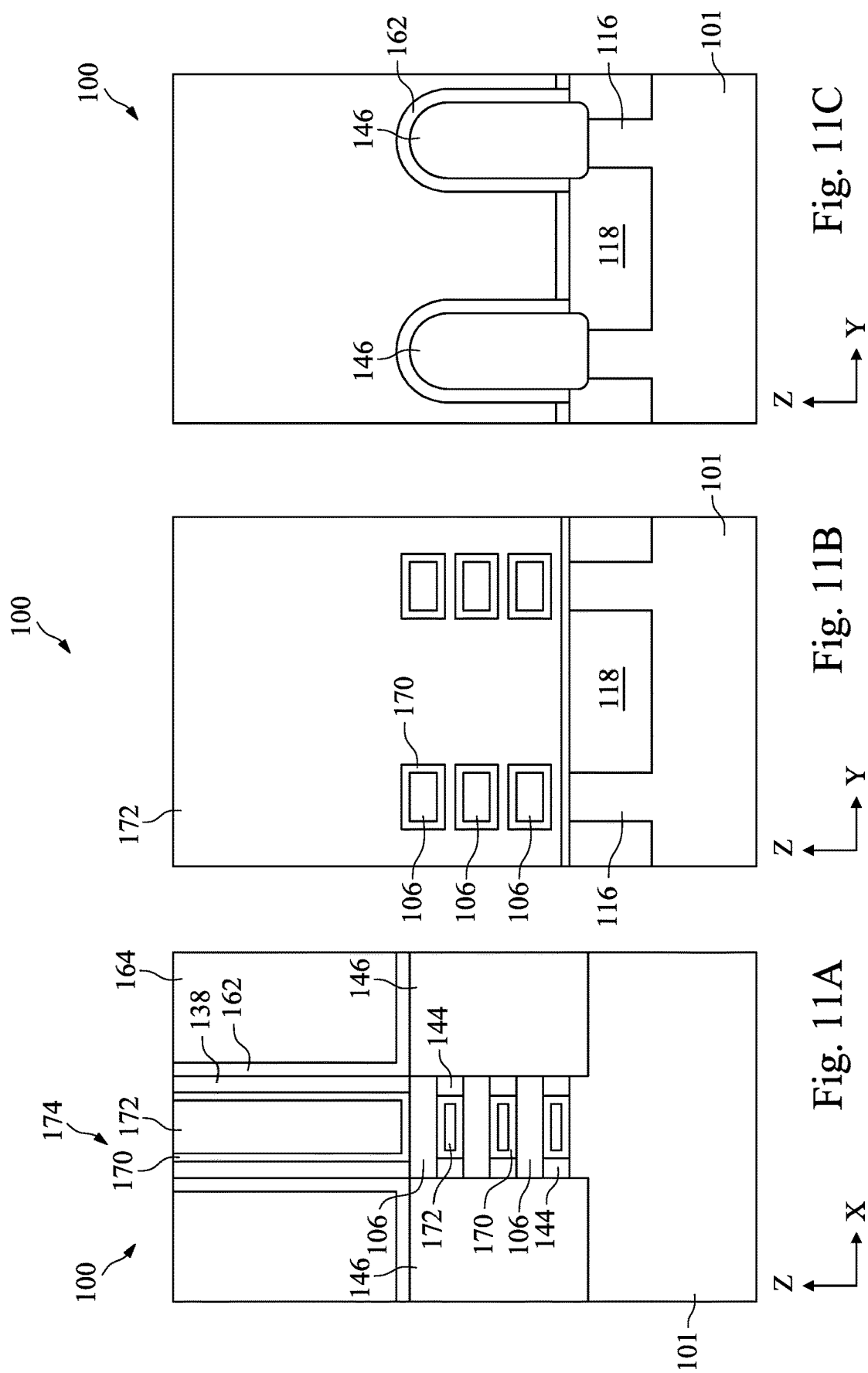

FIGS. 11A, 11B, and 11C are cross-sectional side views of one of various stages of manufacturing the semiconductor device structure 100 taken along line A-A, line B-B, and line C-C of FIG. 6, respectively, in accordance with some embodiments. As shown in FIGS. 11A and 11B, the sacrificial gate structure 130 and the second semiconductor layers 108 are removed. The removal of the sacrificial gate structure 130 and the semiconductor layers 108 forms an opening between gate spacers 138 and between first semiconductor layers 106. The ILD layer 164 protects the S/D regions 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162.

Portions of the second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the gate spacers 138, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

After the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer 170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the ILD layer 164. The gate dielectric layer 170 and the gate electrode layer 172 formed over the ILD layer 164 are then removed by using, for example, CMP, until the top surface of the ILD layer 164 is exposed.

Figure 13:
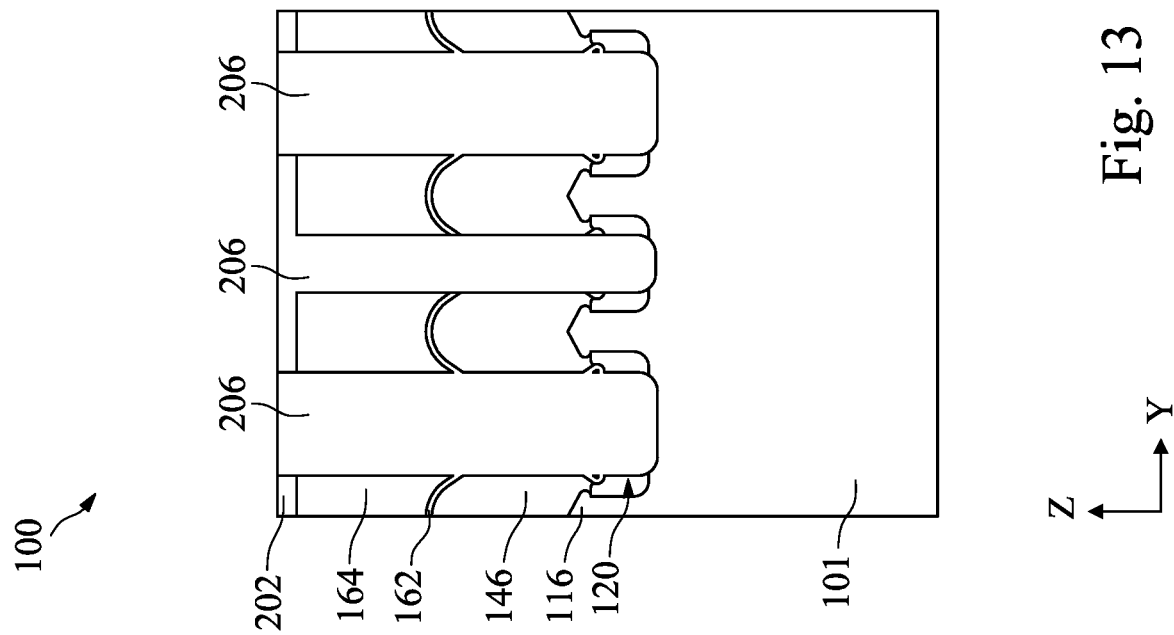
FIGS. 12 and 13 are cross-sectional side views of various stages of manufacturing the semiconductor device structure taken along line A-A of FIG. 6, in accordance with some embodiments.
Figure 12:
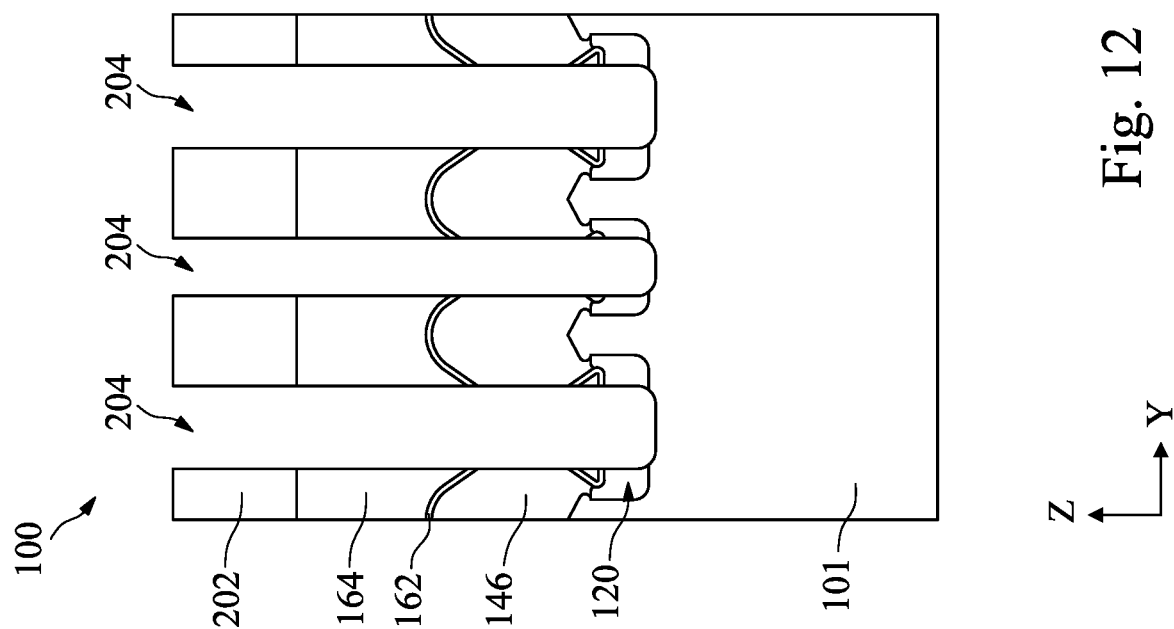

FIGS. 12 and 13 are cross-sectional side views of various stages of manufacturing the semiconductor device structure 100 taken along line A-A of FIG. 6, in accordance with some embodiments. As shown in FIG. 12, a hard mask 202 is formed on the ILD layer 164. The hard mask 202 may include a dielectric material, such as SiN, SiCN, SiOCN, SiOC, or other suitable dielectric material. The hard mask 202 may be used to form openings 204 in the ILD layer 164, the CESL 162, and the isolation regions 120. The openings 204 may be formed between adjacent S/D regions 146. In the channel regions, the openings 204 are formed in the gate electrode layer 172, the gate dielectric layer 170, and the isolation regions 120 (FIG. 11B). The openings 204 may be formed to separate the gate structure 174 into multiple portions of the gate structure 174 (or separate the gate electrode layer 172 into multiple gate electrode layers 172). The process may be referred to as a cut metal gate (CMG) process. The openings 204 may be formed by one or more etch processes. In some embodiments, portions of the substrate 101 are exposed in the openings 204.

As shown in FIG. 13, a dielectric material 206 is formed in each opening 204. The dielectric material 206 may include any suitable dielectric material, such as SiN. A planarization process may be performed to remove the portion of the dielectric material 206 formed on the hard mask 202.

Figure 14:
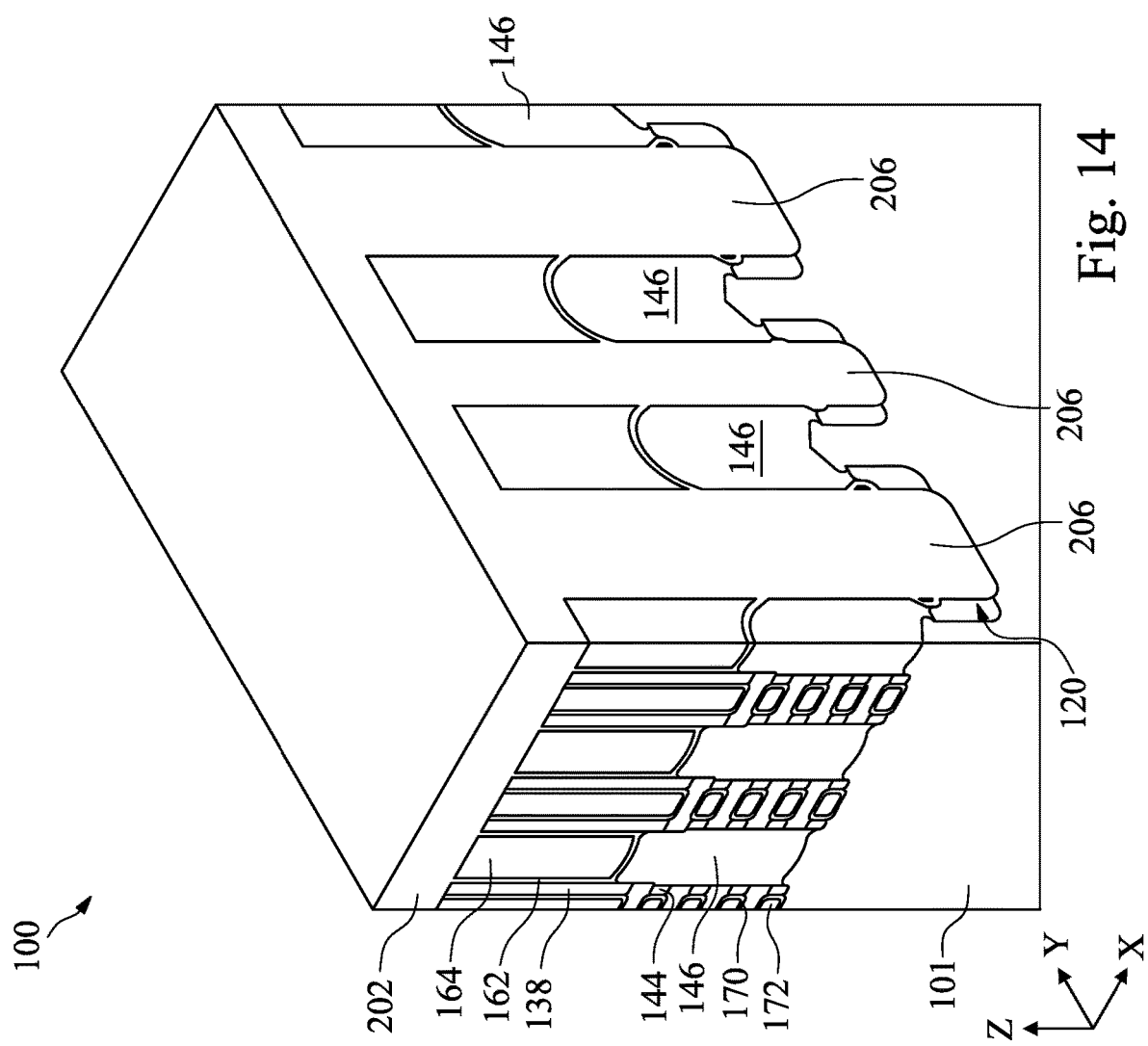
FIGS. 14-21 are perspective views of various stages of manufacturing the semiconductor device structure, in accordance with some embodiments.
Figure 15:
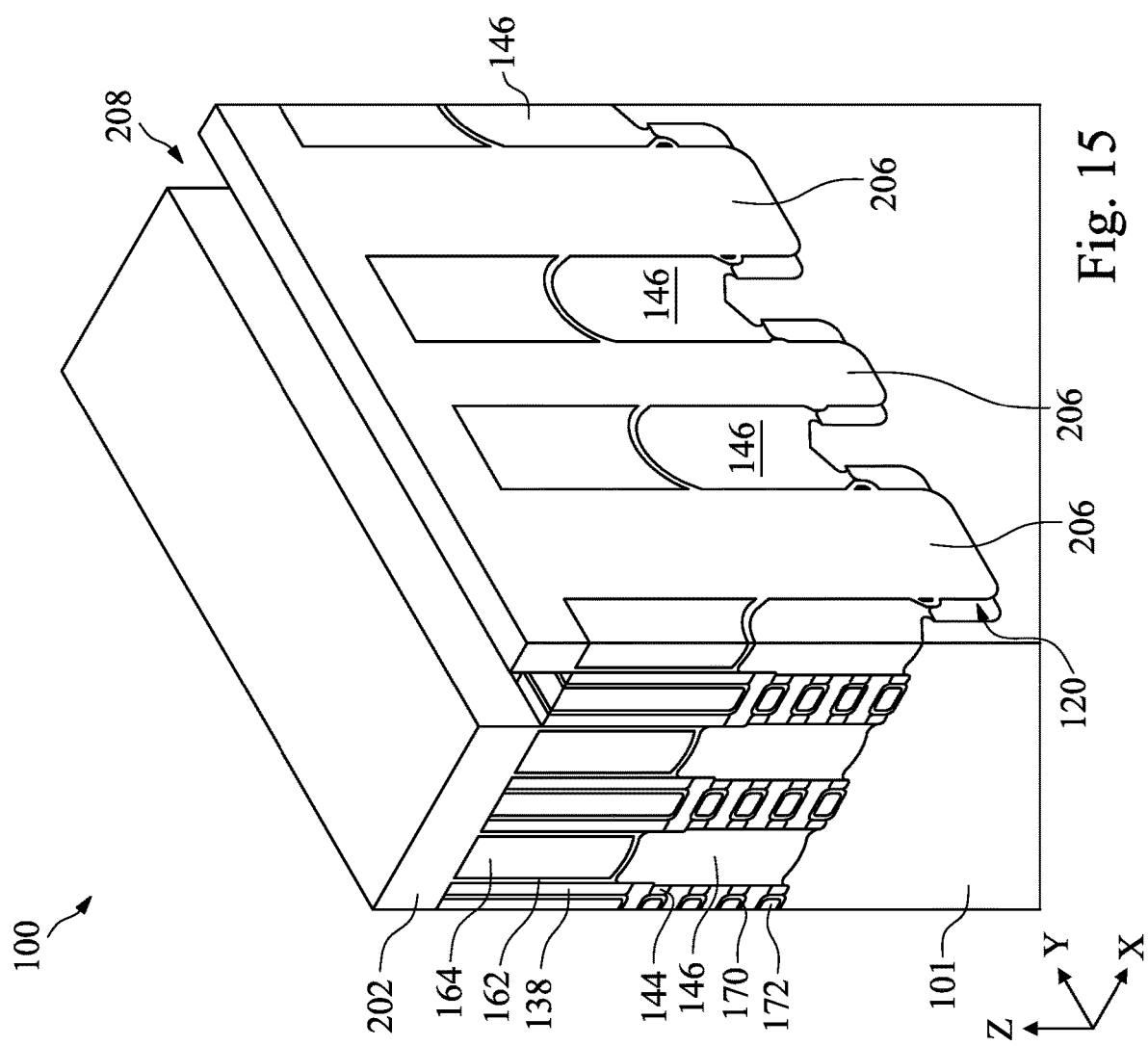

FIGS. 14-21 are perspective views of various stages of manufacturing the semiconductor device structure 100, in accordance with some embodiments. FIG. 14 is a perspective view of the semiconductor device structure 100 of FIG. 13. As shown in FIG. 14, multiple dielectric materials 206 are formed across one or more gate electrode layers 172 (or gate structures 174). Next, as shown in FIG. 15, an opening 208 is formed in the hard mask 202 to expose a gate structure 174 (the gate dielectric layer 170 and the gate electrode layer 172). Portions of the dielectric materials 206 are also exposed in the opening 208. A patterned photoresist (not shown), such as a trilayer photoresist, may be formed on the hard mask 202 to form the opening 208.

Figure 16:
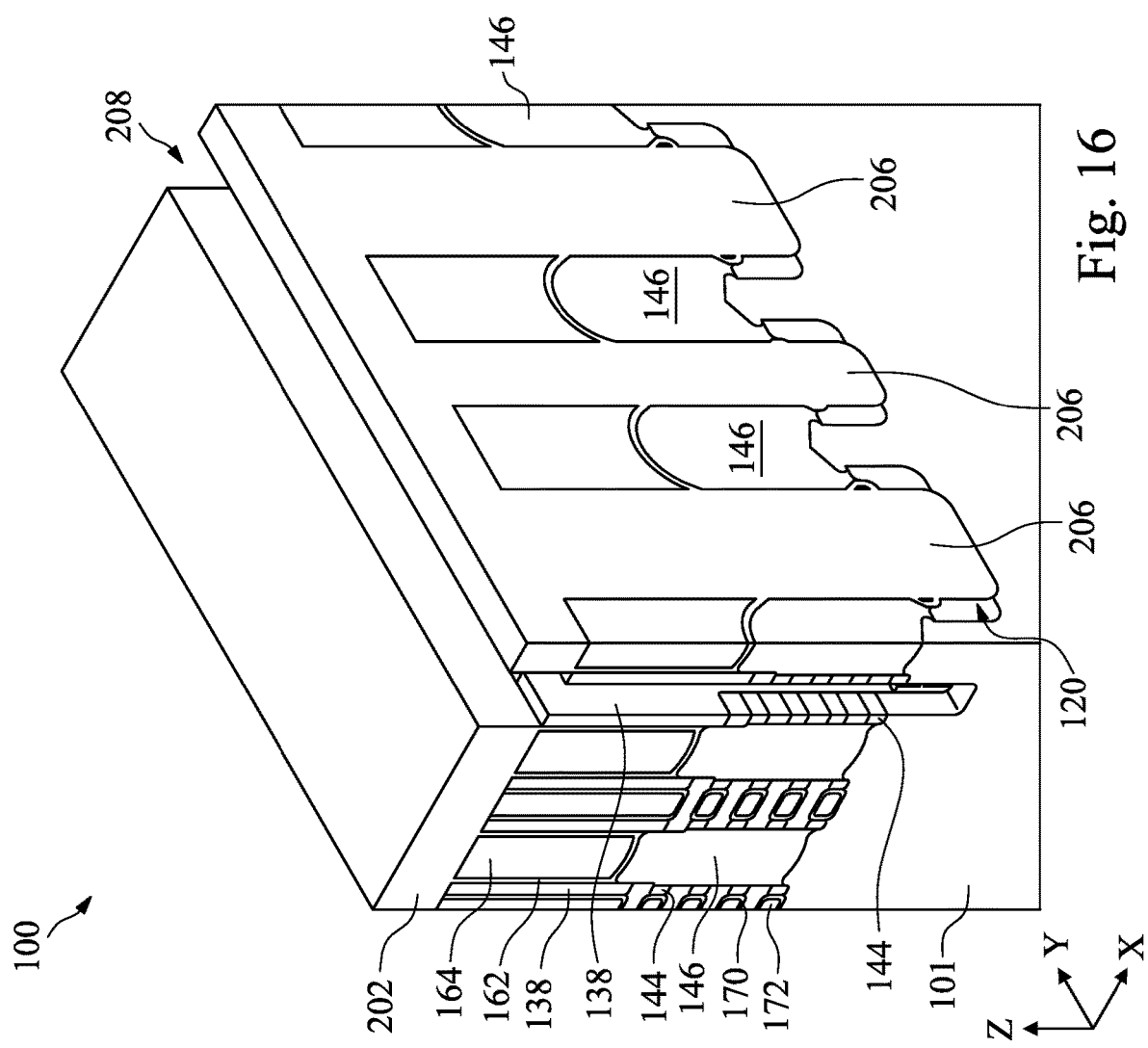

As shown in FIG. 16, the gate electrode layer 172 and the gate dielectric layer 170 exposed in the opening 208 are removed. Portions of the first semiconductor layers 106 disposed below the removed gate electrode layer 172 are also removed. The removal of the gate electrode layer 172, the gate dielectric layer 170, and the first semiconductor layers 106 may be performed by one or more etch processes. The one or more etch processes may be selective etch processes. As a result, the gate spacers 138, the hard mask 202, and the dielectric materials 206 are not substantially affected. Furthermore, the one or more etch processes may include at least one anisotropic etch process, and portions of the first semiconductor layers 106 located under the gate spacers 138 and between dielectric spacers 144 are not removed. In some embodiments, the depth of the opening 208 is shallower than the depth of the opening 204 (FIG. 12).

Figure 17:
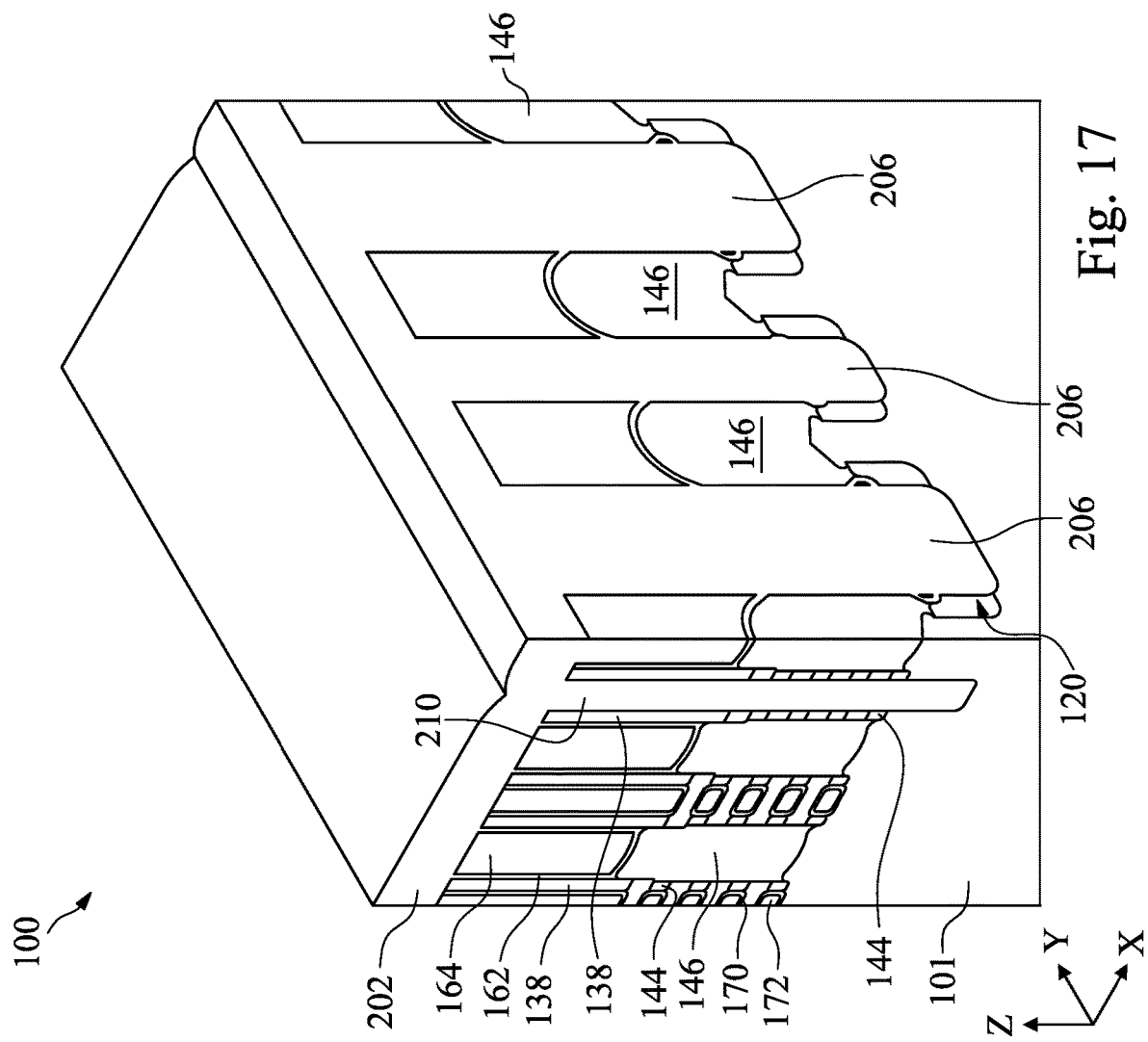

As shown in FIG. 17, a dielectric material 210 is formed in the opening 208. The dielectric material 210 may include any suitable dielectric material, such as SiN. In some embodiments, the dielectric material 210 includes the same material as the dielectric material 206. In some embodiments, a bottom surface of the dielectric material 210 is located at a level above the level of a bottom surface of the dielectric material 206. The processes for forming the dielectric materials 206 and the dielectric material 210 may be optional.

Figure 18:
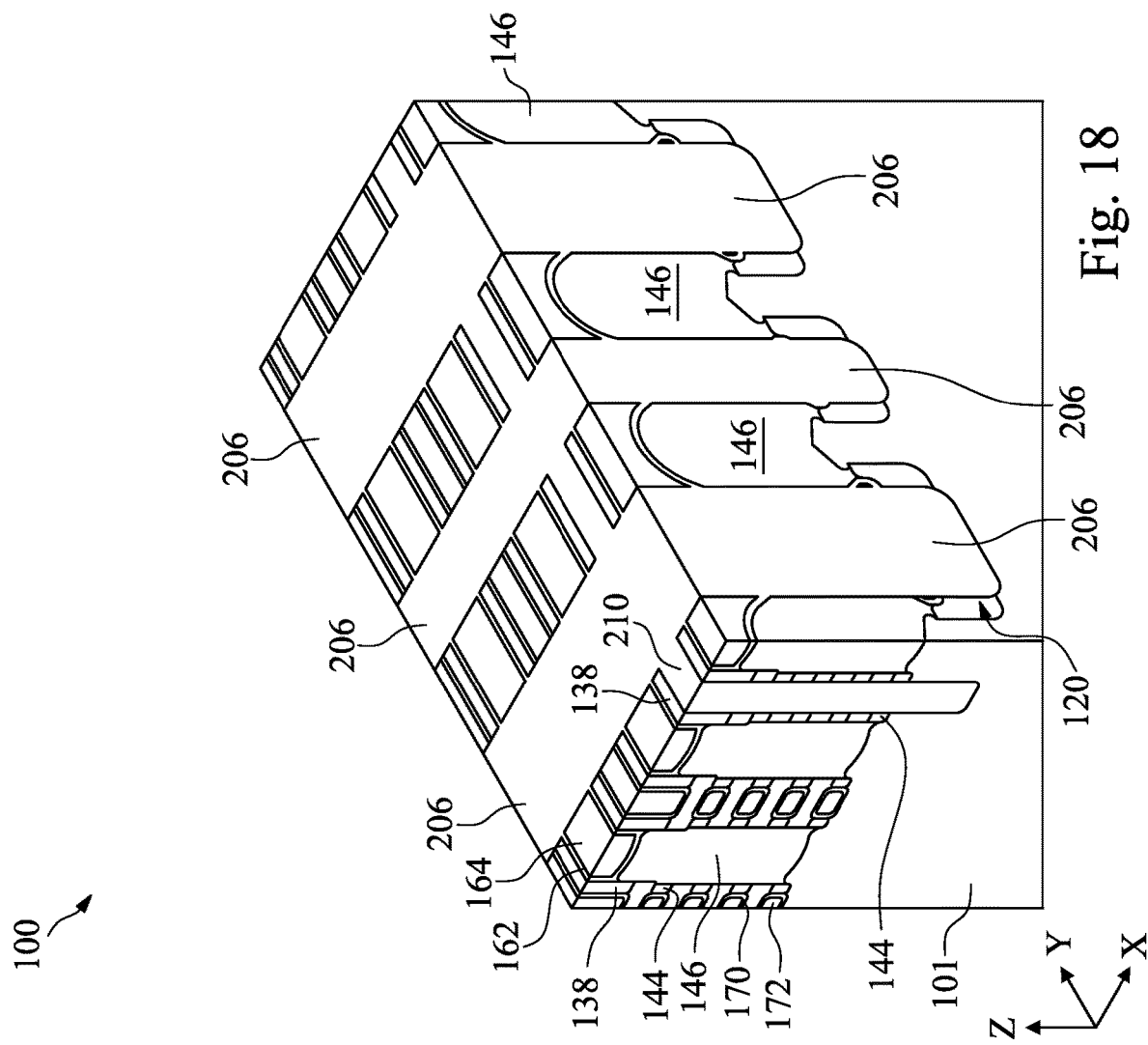

As shown in FIG. 18, the hard mask 202 is removed. The hard mask 202 may be removed by any suitable process. In some embodiments, a planarization process, such as a CMP process, is performed to remove the hard mask 202. As a result, the semiconductor device structure 100 has a substantially planar top surface. As shown in FIG. 18, at the current stage of manufacturing of the semiconductor device structure 100, the top surface of the semiconductor device structure 100 includes a top surface of each dielectric material 206, a top surface of the dielectric material 210, a top surface of each gate electrode layer 172, a top surface of each gate spacer 138, and a top surface of the ILD layer 164. In other words, all the top surfaces of the dielectric materials 206, the dielectric material 210, the gate electrode layers 172, the gate spacers 138, and the ILD layer 164 are substantially coplanar. The gate dielectric layer 170 and the CESL 162 may also include top surfaces that are substantially coplanar with the above-mentioned top surfaces.

Figure 19:
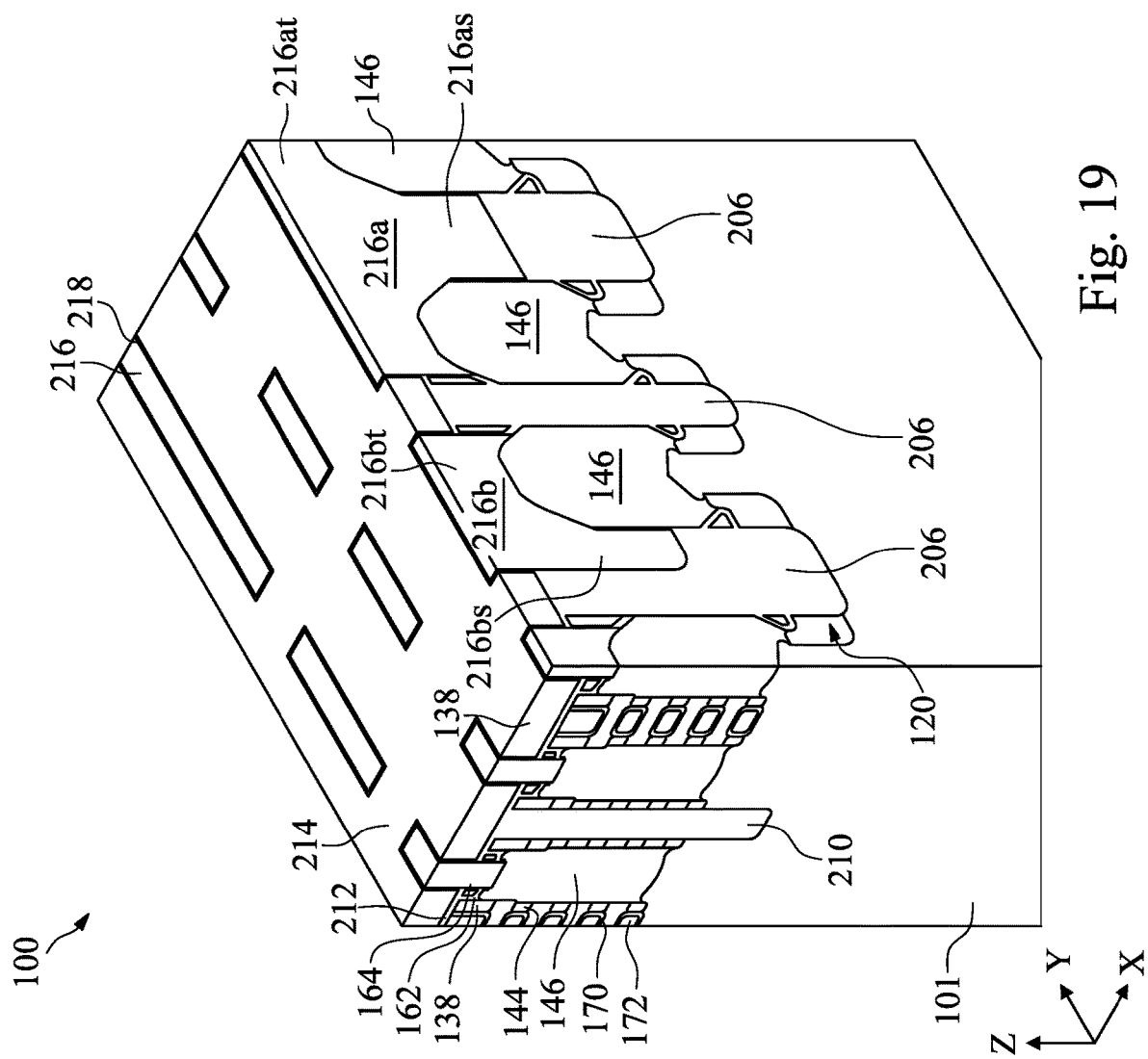

As shown in FIG. 19, an etch stop layer (ESL) 212 is formed on the top surface of the semiconductor device structure 100, another ILD layer 214 is formed on the ESL 212, and conductive contacts 216 are formed in the ILD layer 214 and the ESL 212 to be in electrical contact with the S/D regions 146. A silicide layer (not shown) is formed between each S/D region 146 and the corresponding conductive contact 216. The conductive contact 216 may include an electrically conductive material, such as TiN, W, Ru, Mo, Co, Cu, or other suitable electrically conductive material. In some embodiments, an optional barrier layer 218 is utilized to prevent diffusion of the conductive contact 216, if the conductive contact 216 includes a material that is susceptible to diffusion. In some embodiments, the barrier layer 218 is not used, and contact resistance is reduced.

As shown in FIG. 19, conductive contacts 216 include conductive contacts 216a and conductive contacts 216b. Each conductive contact 216a is in contact with two S/D regions 146, and each conductive contact 216b is in contact with one S/D region 146. The numbers and locations of the conductive contacts 216a, 216b shown in FIG. 19 are for illustrative purposes and not intended to be limiting beyond what is specifically recited in the claims. The conductive contacts 216a, 216b may be formed in the dielectric materials 206, as shown in FIG. 19. In some embodiments, the conductive contacts 216a, 216b are in contact with source regions of the S/D regions 146. The conductive contact 216b may be formed over a top of the S/D region 146 and adjacent one or more side surfaces of the S/D region 146, as shown in FIG. 19. For example, the conductive contact 216b includes a top portion 216bt disposed over the S/D region 146 and a side portion 216bs disposed adjacent one or more side surfaces of the S/D region 146. In some embodiments, a portion of the dielectric material 206 is disposed between a side surface of the S/D region 146 and the side portion 216bs of the conductive contact 216b. In some embodiments, the conductive contact 216b is disposed over the S/D region 146 and surrounds three side surfaces of the S/D region 146, and the last side surface of the S/D region 146 is in contact with the dielectric material 206. Similarly, the conductive contacts 216a may be disposed over the tops of the two S/D regions 146 and surrounds three side surfaces of each of the two S/D regions 146. For example, the conductive contact 216a includes a top portion 216at disposed over the two S/D regions 146 and a side portion 216as disposed between the two S/D regions 146.

It is understood that the semiconductor device structure 100 may undergo further back-end-of-line (BEOL) processes to form contacts/vias, interconnect metal layers, dielectric layers, passivation layers, etc. After the BEOL processes, the semiconductor device structure 100 is flipped over for backside processing.

Figure 20:
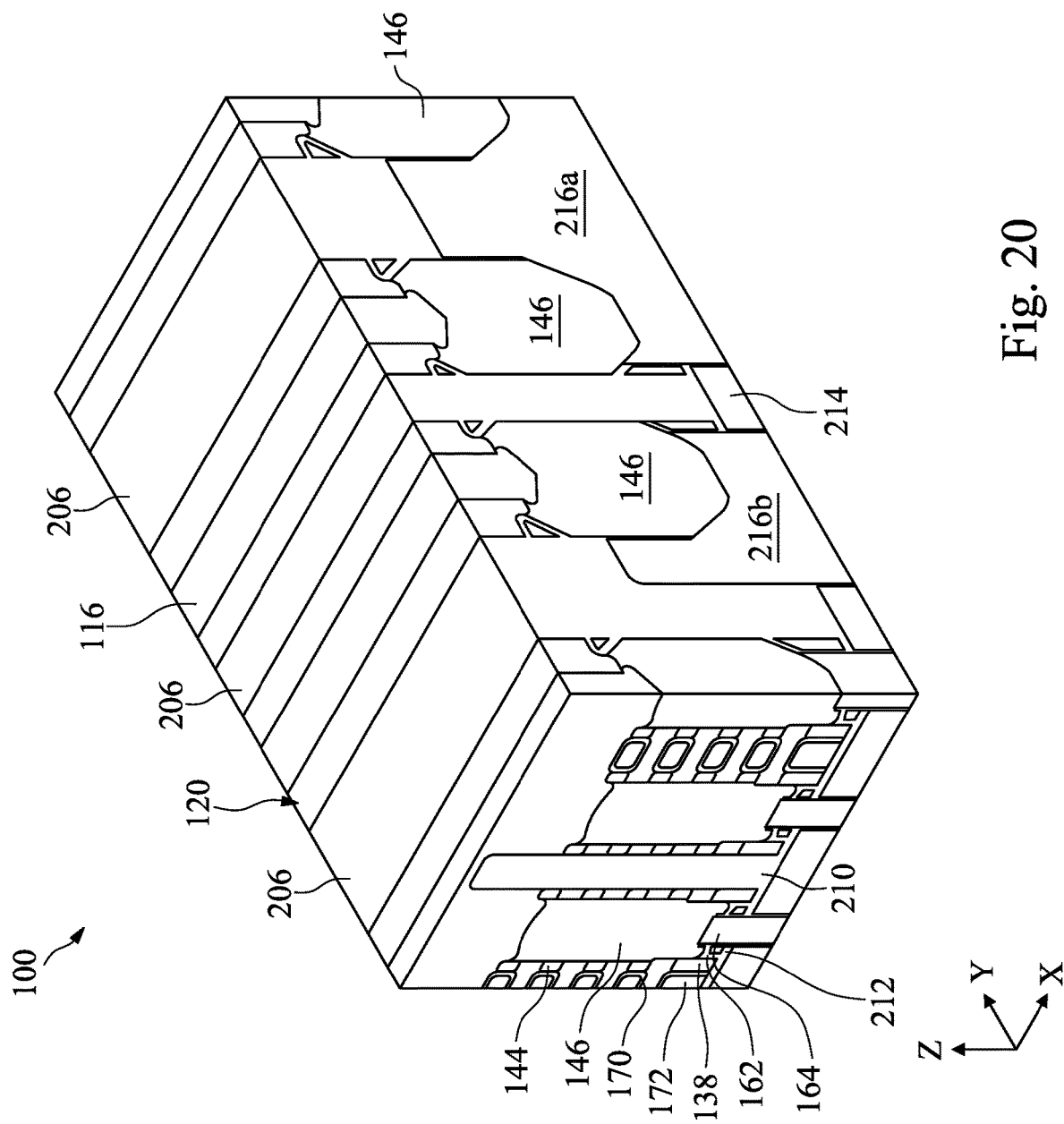

As shown in FIG. 20, after flipping over the semiconductor device structure 100, the substrate 101 is thinned down to expose the dielectric materials 206 and the isolation regions 120. As described above, in some embodiments, the dielectric material 210 may extend to a level above a level of the dielectric materials 206. Thus, the dielectric material 210 is not exposed. In some embodiments, the substrate 101 is removed, and the well portions 116 are exposed, as shown in FIG. 20.

Figure 21:
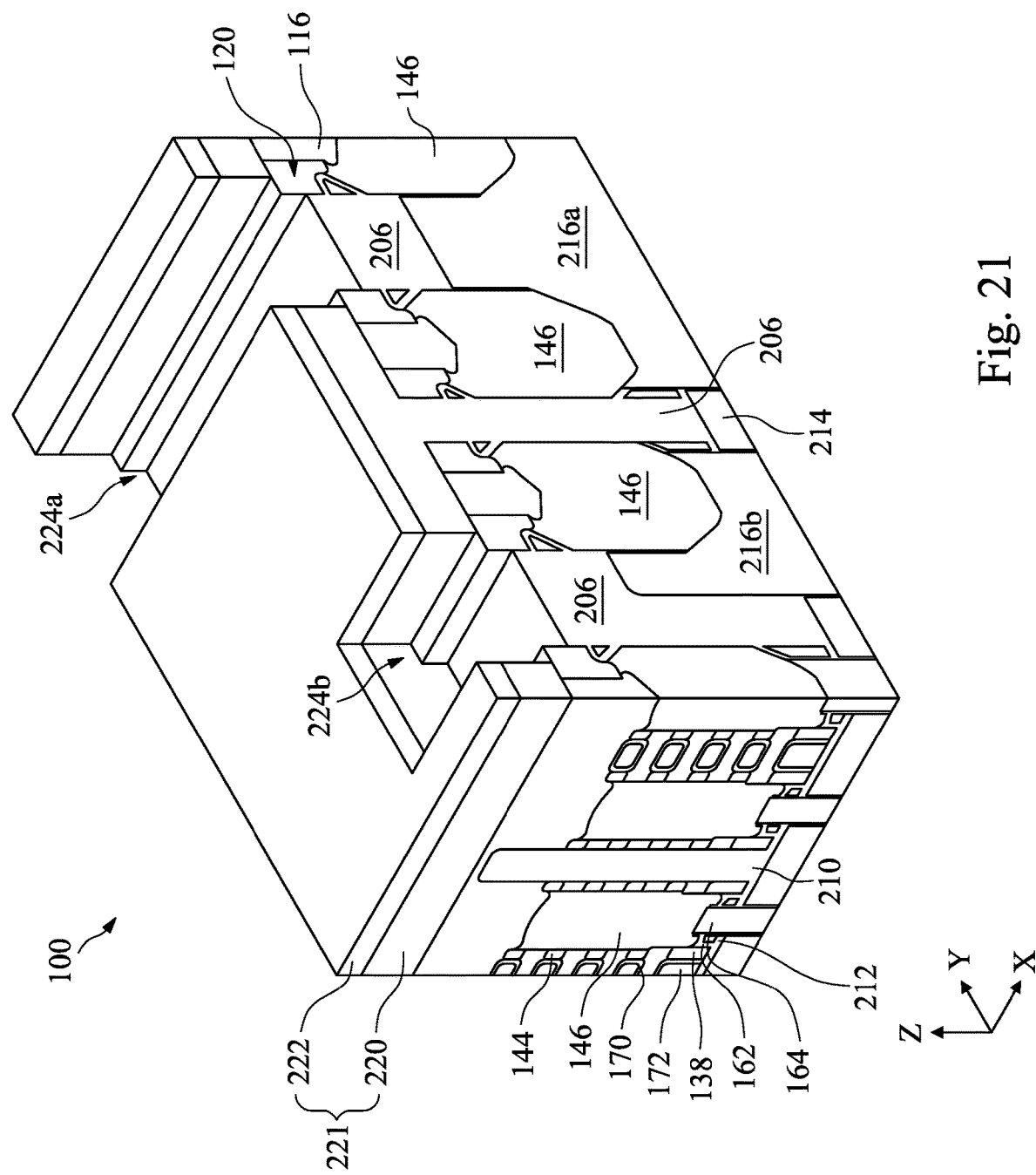

As shown in FIG. 21, a patterned mask structure 221 is formed on the exposed well portions 116, the isolation regions 120, and a portion of the dielectric material 206. The patterned mask structure 221 includes a first layer 220 and a second layer 222 disposed on the first layer 220. The first layer 220 may be any suitable dielectric material, such as SiN. The second layer 222 may be any suitable dielectric material different from the dielectric material of the first layer 220. In some embodiments, the second layer 222 includes an oxide, such as silicon oxide. Openings 224a, 224b are formed in the patterned mask structure 221, as shown in FIG. 21. The opening 224a exposes portions of the isolation regions 120 and the dielectric material 206 that is in contact with the conductive contact 216a (or the barrier layer 218 if present). The opening 224b exposes portions of the isolation regions 120 and a portion of the dielectric material 206 that is in contact with the conductive contact 216b (or the barrier layer 218 if present).

Figure 22:
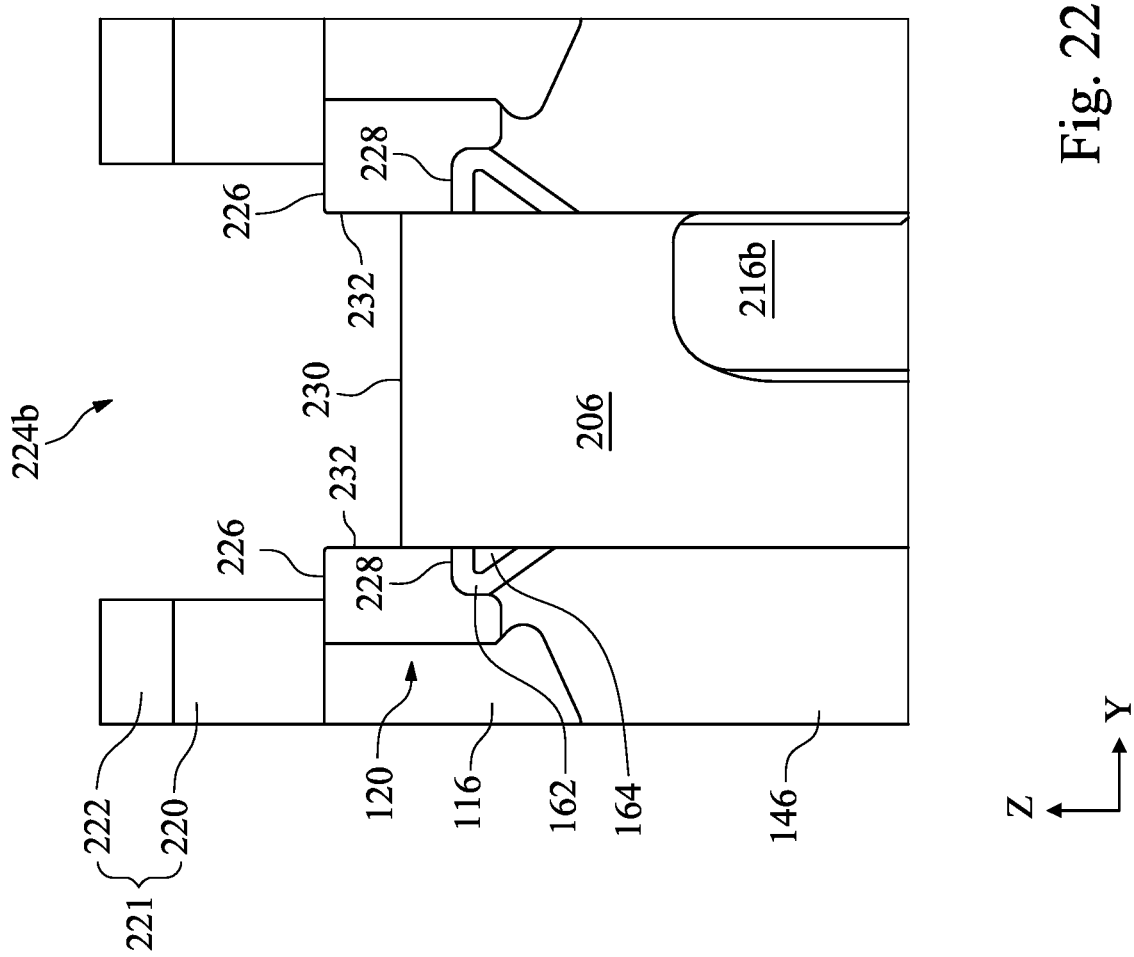
FIG. 22 is a cross-sectional side view of a portion of the semiconductor device structure of FIG. 21, in accordance with some embodiments.

FIG. 22 is a cross-sectional side view of a portion of the semiconductor device structure 100 of FIG. 21, in accordance with some embodiments. As shown in FIG. 22, the opening 224b exposes a portion of a top surface 226 (bottom surface if the semiconductor device structure 100 is oriented front side up) of the isolation regions 120. For example, the patterned mask structure 221 covers a portion of the top surface 226 of each of the two isolation regions 120, and the dielectric material 206 disposed between the two isolation regions 120 is recessed. Each of the two isolation regions 120 includes a bottom surface 228 (top surface if the semiconductor device structure 100 is oriented front side up) opposite the top surface 226, and the dielectric material 206 is recessed so a top surface 230 (bottom surface if the semiconductor device structure 100 is oriented front side up) of the dielectric material 206 is located at a level between the top surface 226 and the bottom surface 228 of the isolation region 120. The recess of the dielectric material 206 exposes side surfaces 232 of the two isolation regions 120. The top surface 226 and the side surface 232 form a step in the opening 224b, and the step is used to align a conductive feature subsequently formed in the dielectric material 206. Thus, if the dielectric material 206 is not recessed, the side surface 232 would not be exposed. On the other hand, if the dielectric material 206 is recessed to a level below the bottom surface 228 of the isolation region 120, there is a chance to expose and damage the S/D regions 146. Similar features are exposed in the opening 224a (FIG. 22).

Figure 23:
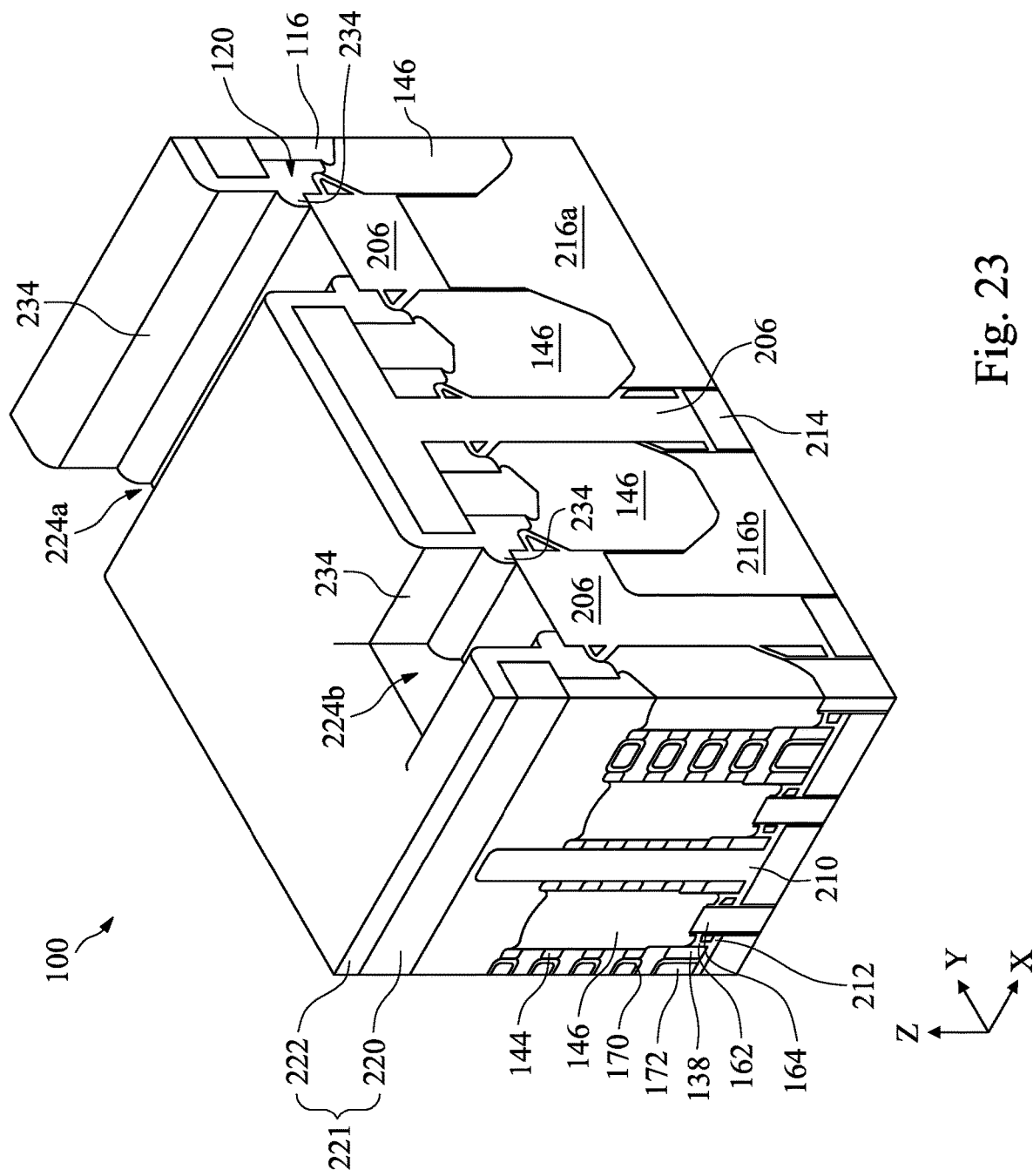
FIG. 23 is a perspective view of one of various stages of manufacturing the semiconductor device structure, in accordance with some embodiments.
Figure 24:
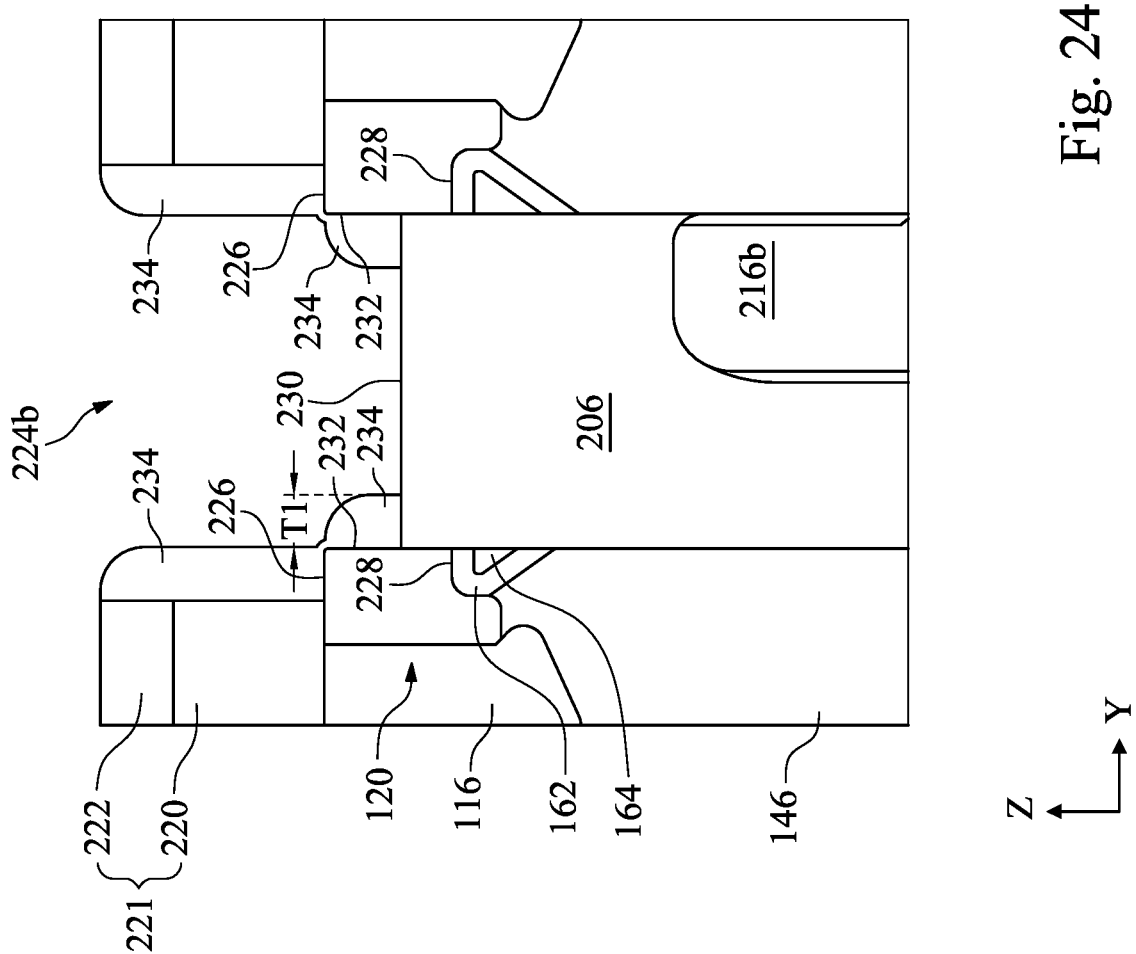
FIG. 24 is a cross-sectional side view of a portion of the semiconductor device structure of FIG. 23, in accordance with some embodiments.

FIG. 23 is a perspective view of one of various stages of manufacturing the semiconductor device structure 100, in accordance with some embodiments. As shown in FIG. 23, a liner 234 is formed on the sidewalls in the openings 224a, 224b. FIG. 24 is a cross-sectional side view of a portion of the semiconductor device structure 100 of FIG. 23, in accordance with some embodiments. As shown in FIGS. 23 and 24, the liner 234 is formed on the side surfaces of the patterned mask structure 221 and the side surfaces 232 of the isolation regions 120. The liner 234 may include any suitable dielectric material, such as an oxide. In some embodiments, the liner 234 includes the same material as the second layer 222. The liner 234 may be formed by first forming a conformal layer on the semiconductor device structure 100, followed by an anisotropic etch process to remove portions of the conformal layer formed on horizontal surfaces of the semiconductor device structure 100. For example, the conformal layer is deposited on the top surface of the second layer 222, the side surfaces of the first and second layers, the top surfaces 226 and the side surfaces 232 of the isolation regions 120, and the top surface 230 of the dielectric material 206. Then, the anisotropic etch process is performed to remove the portions of the conformal layer formed on the top surface of the second layer 222 and the top surface 230 of the dielectric material 206, as shown in FIG. 24.

As shown in FIG. 24, the remaining portion of the liner 234 disposed on the side surface 232 of the isolation region 120 has a thickness T1 along the Y direction. The thickness T1 may range from about 3 nm to about 10 nm, and the thickness T1 may be the defined by the thickness of the conformal layer. The portion of the liner 234 disposed on the side surface 232 of the isolation region 120 helps to align the conductive feature subsequently formed in the dielectric material 206. Thus, if the thickness T1 is less than about 3 nm, the subsequently formed conductive feature may be too close to the S/D regions 146. On the other hand, if the thickness T1 is greater than about 10 nm, the dimension of the subsequently formed conductive feature along the Y direction may be too small. As a result, contact resistance may be increased.

Figure 25:
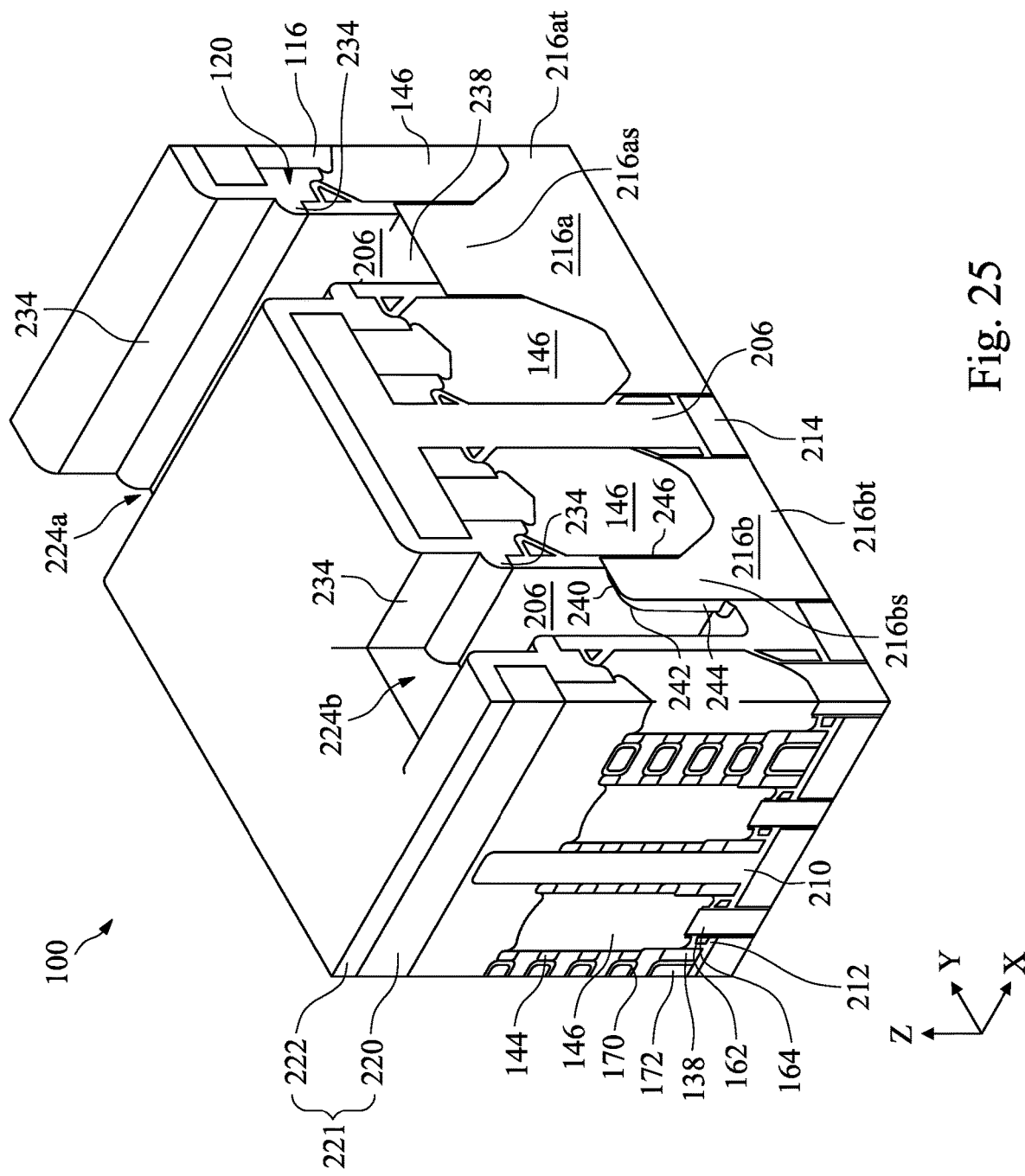
FIG. 25 is a perspective view of one of various stages of manufacturing the semiconductor device structure, in accordance with some embodiments.
Figure 26:
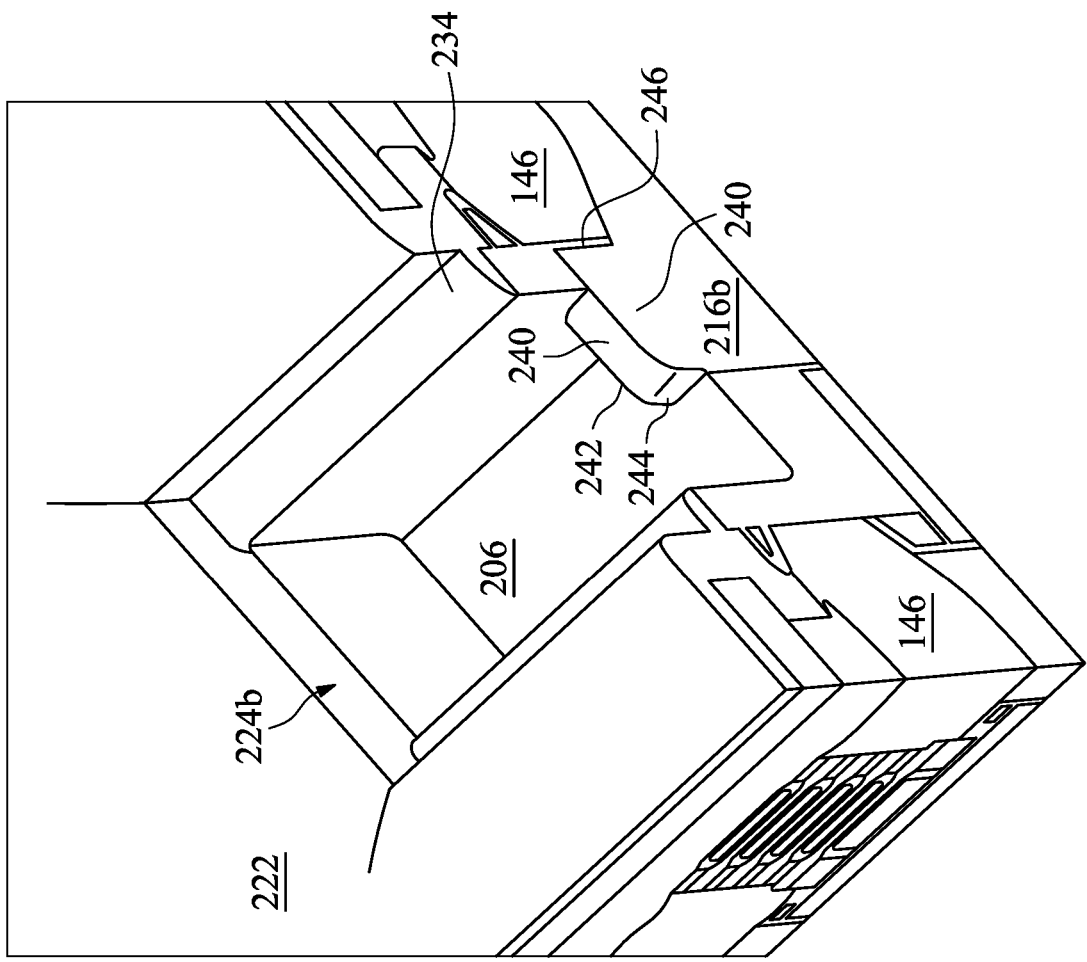
FIG. 26 is a top view of a portion of the semiconductor device structure of FIG. 25, in accordance with some embodiments.

FIG. 25 is a perspective view of one of various stages of manufacturing the semiconductor device structure 100, in accordance with some embodiments. FIG. 26 is a top view of a portion of the semiconductor device structure 100 of FIG. 25, in accordance with some embodiments. As shown in FIGS. 25 and 26, the portion of the dielectric material 206 exposed in the opening 224b and the dielectric material 206 exposed in the opening 224a are etched back. As a result, a portion of the conductive contact 216a is exposed in the opening 224a, and a portion of the conductive contact 216b is exposed in the opening 224b. A top surface 238 (bottom surface before flipping the semiconductor device structure 100) of the side portion 216as of the conductive contact 216a is exposed in the opening 224a. In some embodiments, as shown in FIGS. 25 and 26, multiple surfaces of the side portion 216bs of the conductive contact 216b are exposed in the opening 224b. For example, a portion of a top surface 240, a portion of a first side surface 242, a portion of a second side surface 244, and a portion of a third side surface (not shown) opposite the first side surface 242 are exposed in the opening 224b. The first side surface 242 is connected to the second side surface 244, which is connected to the third side surface (not shown), which is connected to a fourth side surface 246, which is connected to the first side surface 242. The fourth side surface 246 may be located adjacent the S/D region 146. The fourth side surface 246 may not be exposed in the opening 224b.

In some embodiments, barrier layers (not shown) are used and the conductive contacts 216a, 216b are formed on the barrier layers. In such embodiments, the portions of the barrier layer in contact with the portion of the top surface 240, the portion of the first side surface 242, the portion of the second side surface 244, and the portion of the third side surface (not shown) opposite the first side surface 242 are exposed in the opening 224b. Similarly, the portion of the barrier layer in contact with the top surface 238 of the side portion 216as of the conductive contact 216a is exposed in the opening 224a.

Figure 27:
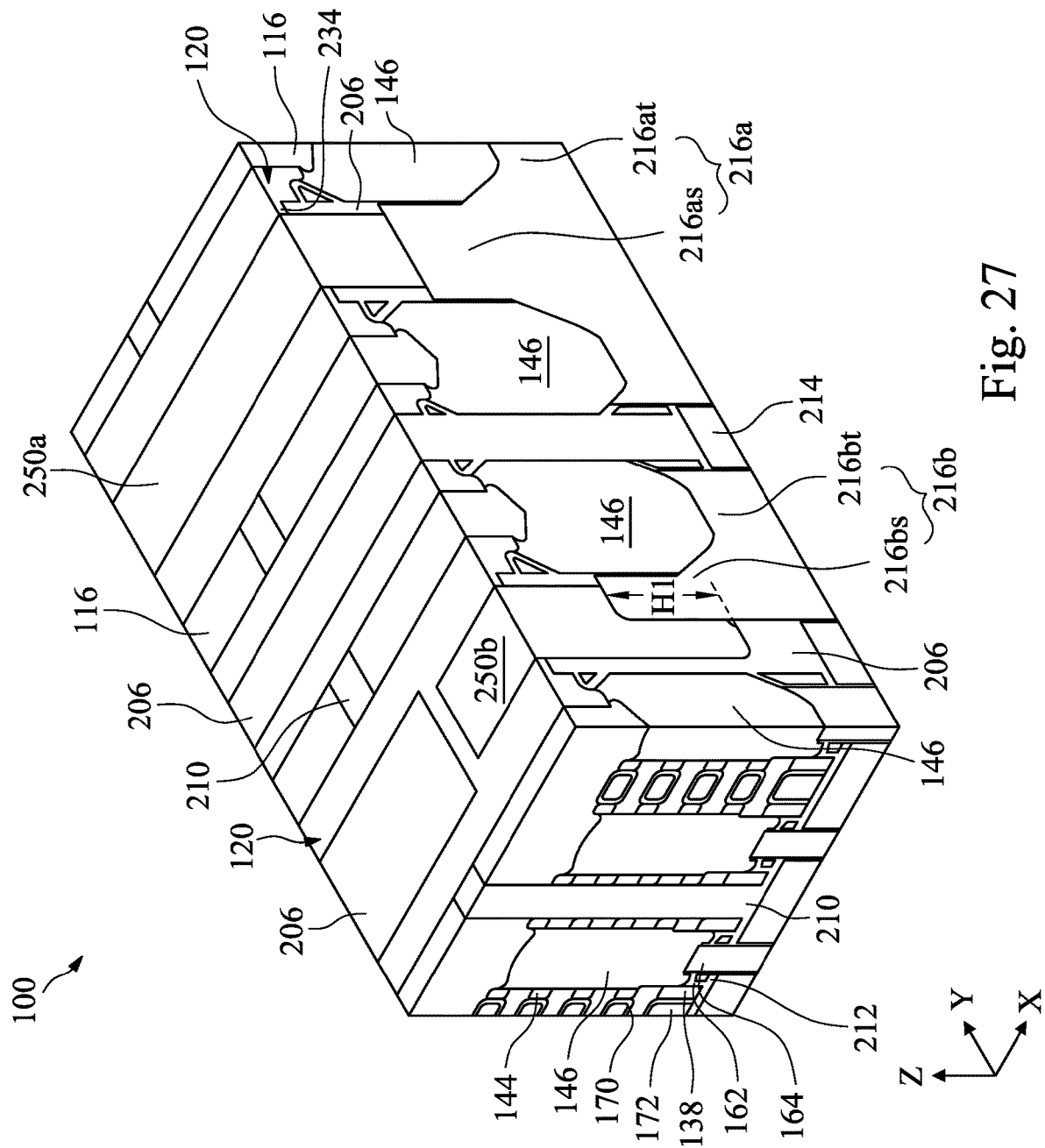
FIGS. 27-29 are perspective views of one of various stages of manufacturing the semiconductor device structure, in accordance with some embodiments.
Figure 28:
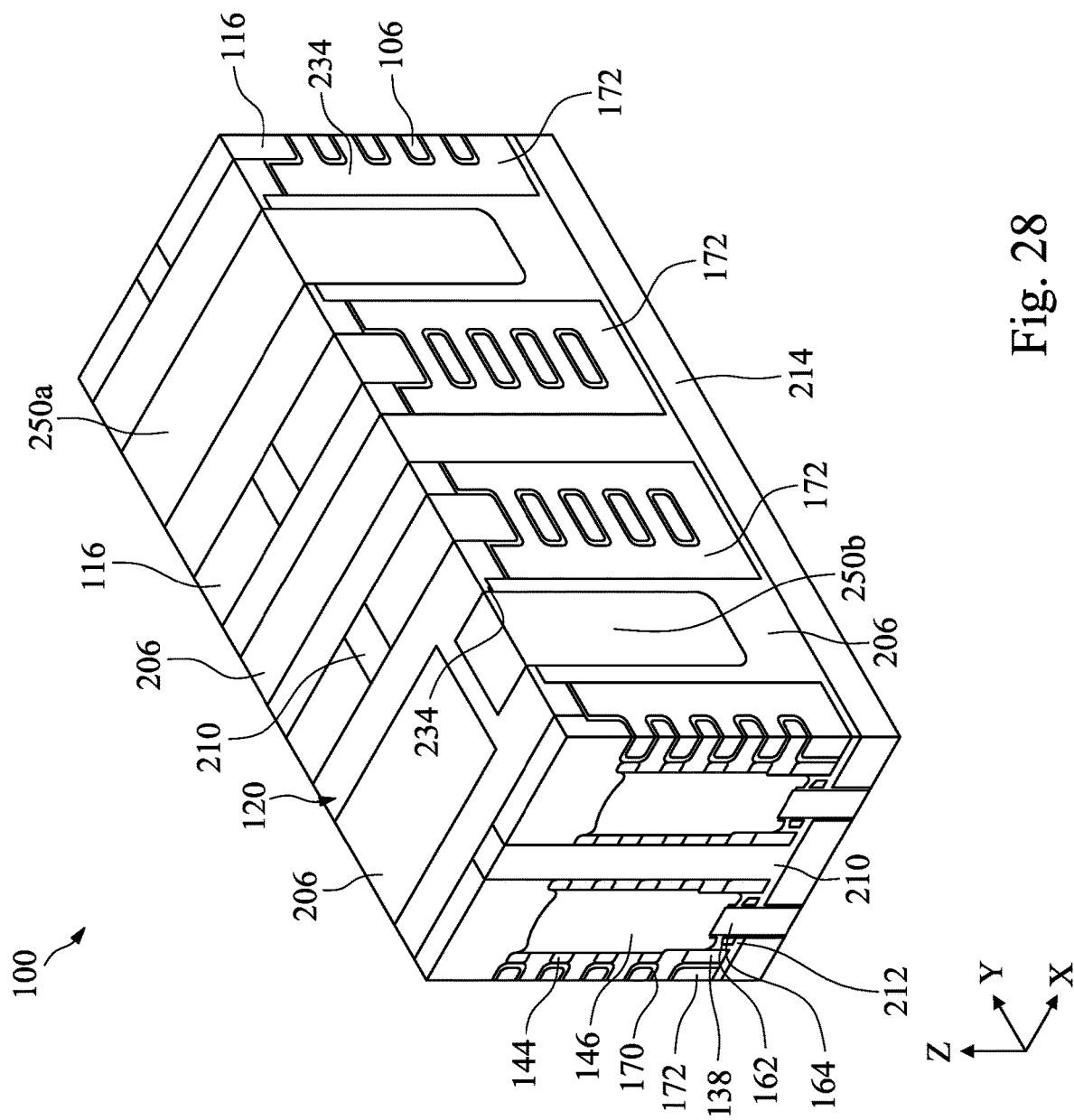
Figure 29:
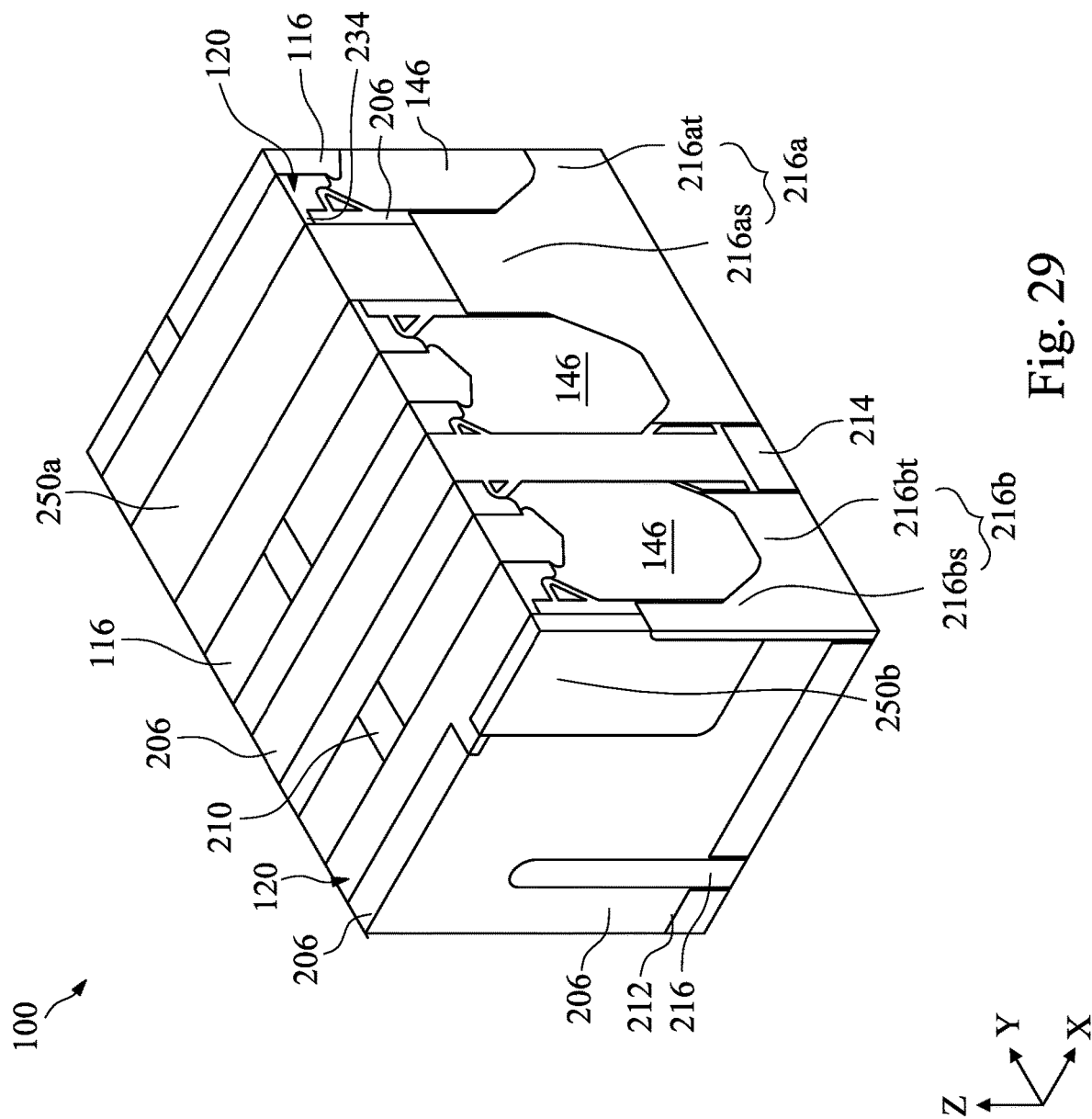

FIGS. 27-29 are perspective views of one of various stages of manufacturing the semiconductor device structure 100, in accordance with some embodiments. As shown in FIG. 27, conductive features 250a, 250b are formed in the openings 224a, 224b, respectively. In some embodiments, the conductive features 250a, 250b are referred to as power vias for supplying power to the devices of the semiconductor device structure 100. The conductive features 250a, 250b may each have a dimension along the Y direction ranging from about 5 15 nm to about 150 nm and a dimension along the X direction that is greater than or equal to one contacted polysilicon pitch (CPP). The conductive feature 250a, 250b may each include an electrically conductive material, such as TiN, W, Ru, Mo, Co, Cu, or other suitable electrically conductive material. Similar to the conductive contacts 216, barrier layers (not shown) may or may not be used for the conductive features 250a, 250b. In some embodiments, the conductive feature 250b includes a portion in contact with the second side surface 244 (FIG. 25) of the side portion 216bs of the conductive contact 216b, and the portion of the conductive feature 250b may have a height H1 ranging from about 5 nm to about 50 nm. In some embodiments, barrier layers are used for the conductive feature 250b and the conductive contact 216b, and the portion of the conductive feature 250b is in contact with a barrier layer, which is in contact with another barrier layer, which is in contact with the second side surface 244 of the side portion 216bs of the conductive contact 216b. The portion of the conductive feature 250b having the height H1 leads to decreased contact resistance and decreased capacitance. If the height H1 is less than about 5 nm, contact resistance is increased. On the other hand, if the height H1 is greater than about 50 nm, capacitance may be increased.

As shown in FIG. 27, in some embodiments, the conductive feature 250a is in contact with the top surface 238 (FIG. 25) of the side portion 216as of the conductive contact 216a. In some embodiments, barrier layers are used for the conductive feature 250a and the conductive contact 216a, and the conductive feature 250a is in contact with a barrier layer, which is in contact with another barrier layer, which is in contact with the top surface 238 of the side portion 216as of the conductive contact 216a.

After forming the conductive features 250a, 250b, a planarization process may be performed to expose the dielectric material 210, as shown in FIG. 27. As a result, the semiconductor device structure 100 has a substantially planar top surface (bottom surface if the semiconductor device structure 100 is oriented front side up). As shown in FIG. 27, at the current stage of manufacturing of the semiconductor device structure 100, the top surface of the semiconductor device structure 100 includes a top surface of each dielectric material 206, a top surface of the dielectric material 210, a top surface of each isolation region 120, a top surface of each liner 234, a top surface of each well portion 116, a top surface the conductive feature 250a, and a top surface of the conductive feature 250b. In other words, all the top surfaces of the dielectric materials 206, the dielectric material 210, the isolation regions 120, the liners 234, the well portions 116, and the conductive features 250a, 250b are substantially coplanar.

It is understood that the semiconductor device structure 100 may undergo further processes to form a backside interconnect structure on the top surface. A backside power track may be formed in the interconnect structure, and the conductive features 250a, 250b may be electrically connected to the backside power track. By routing the power connection to the backside of the semiconductor device structure, front side metal routing design is relaxed.

FIG. 28 is a perspective view of the semiconductor device structure 100 showing the conductive features 250a, 250b located between the gate electrode layers 172. The conductive features 250a, 250b are electrically isolated from the gate electrode layers 172 by the dielectric materials 206. As described above, the liner 234 helps to align the conductive features 250a, 250b in the dielectric materials 206.

FIG. 29 is a perspective view of the semiconductor device structure 100 showing the conductive features 250b located in the dielectric material 206. The conductive feature 250b may be electrically connected to one conductive contact 216, as shown in FIG. 29. In some embodiments, the conductive feature, such as the conductive feature 250a, may be electrically connected to multiple conductive contacts 216 (FIG. 19). As described above, the conductive features 250a, 250b may be power vias and may be electrically connected to the source regions of the S/D regions 146.

Figure 30B:
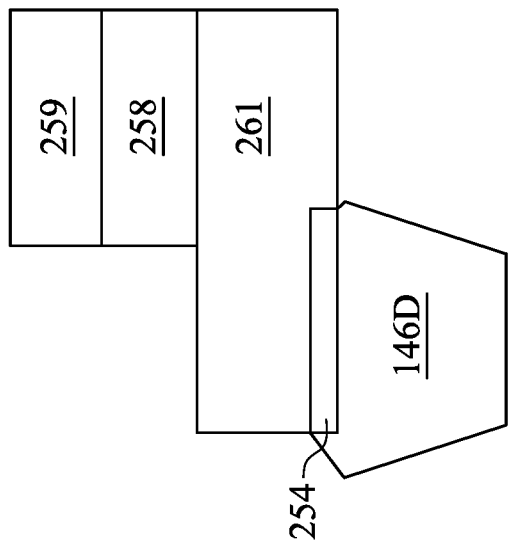
FIGS. 30A and 30B are cross-sectional side views of a source region and a drain region, respectively, in accordance with some embodiments.
Figure 30A:
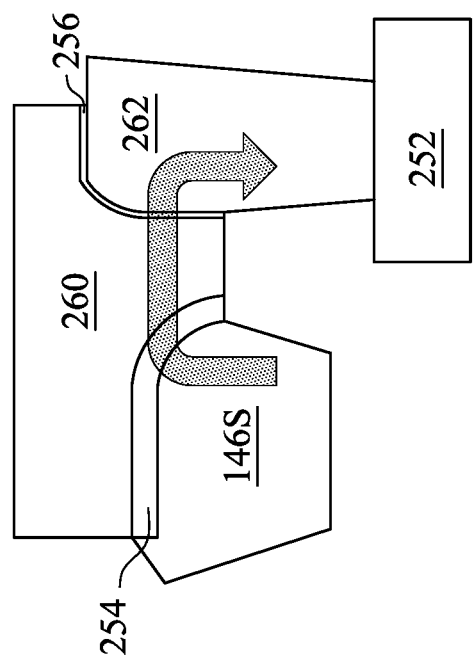

FIGS. 30A and 30B are cross-sectional side views of a source region 146S and a drain region 146D, respectively, in accordance with some embodiments. The source region 146S and the drain region 146D may be the S/D region 146. FIG. 30A illustrates power routing to the source region 146S. As shown in FIG. 30A, the source region 146S is electrically connected to a conductive contact 260 via a silicide layer 254. The conductive contact 260 may be the conductive contact 216a or the conductive contact 216b. The conductive contact 260 is electrically connected to a conductive feature 262, and optional one or more barrier layers 256 may be located between the conductive contact 260 and the conductive feature 262. The conductive feature 262 may be the conductive feature 250a or the conductive feature 250b. The conductive feature 262 may be electrically connected to a conductive feature 252, which may be a conductive line, and the conductive feature 252 may be electrically connected to a power track.

FIG. 30B illustrates signal routing to the drain region 146D. As shown in FIG. 30B, the drain region 146D is electrically connected to a conductive contact 261 via a silicide layer 254. The conductive contact 261 may be the conductive contact 216. The conductive contact 216 is electrically connected to a conductive feature 258, which is electrically connected to a conductive feature 259. The conductive feature 258 may be a conductive via, and the conductive feature 259 may be a conductive line.

Embodiments of the present disclosure provide a semiconductor device structure including a conductive feature 250b for supplying power from a backside of the semiconductor device structure 100. Some embodiments may achieve advantages. For example, the routing resource for both backside power and front-side signal is relaxed.

An embodiment is a semiconductor device structure. The structure includes a first source/drain region disposed under a well portion, a second source/drain region disposed adjacent the first source/drain region, a dielectric material disposed between the first and second source/drain regions, and a conductive contact having a first portion disposed under the first source/drain region and a second portion disposed adjacent the first source/drain region. The second portion is disposed in the dielectric material. The structure further includes a conductive feature disposed in the dielectric material, and the conductive feature is electrically connected to the conductive contact. The conductive feature has a top surface that is substantially coplanar with a top surface of the well portion.

Another embodiment is a semiconductor device structure. The structure includes a first source/drain region, a first gate electrode layer disposed adjacent the first source/drain region, a second source/drain region disposed adjacent the first source/drain region, a second gate electrode layer disposed adjacent the second source/drain region, a dielectric material disposed between the first and second source/drain regions and between the first and second gate electrode layers, a first conductive contact having a first portion disposed under the first and second source/drain regions and a second portion disposed adjacent the first and second source/drain regions, and a first conductive feature disposed in the dielectric material. The first conductive feature is electrically connected to the first conductive contact, and the first conductive feature is disposed between the first and second source/drain regions and between the first and second gate electrode layers.

A further embodiment is a method for forming a semiconductor device structure. The method includes forming a fin structure from a substrate, removing a portion of the fin structure to expose a well portion, forming a source/drain region from the exposed well portion, depositing a dielectric material adjacent the source/drain region, and forming a conductive contact over the source/drain region. A first portion of the conductive contact is disposed over the source/drain region, and a second portion of the conductive contact is disposed in the dielectric material adjacent the source/drain region. The method further includes flipping over the substrate, removing the substrate to expose the dielectric material, and forming a conductive feature in the dielectric material. The conductive feature is electrically connected to the conductive contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
   forming a fin structure from a substrate;
   removing a portion of the fin structure to expose a well portion;
   forming a source/drain region from the exposed well portion;
   depositing a dielectric material adjacent the source/drain region;
   forming, from a front side of the dielectric material, a front side source/drain conductive contact over the source/drain region, wherein a first portion of the front side source/drain conductive contact is disposed over the source/drain region, and a second portion of the front side source/drain conductive contact is disposed in the dielectric material adjacent the source/drain region;
   flipping over the substrate;
   removing the substrate to expose the dielectric material;
   forming, from a back side of the dielectric material, an opening in the dielectric material to expose the front side source/drain conductive contact;
   forming a back side conductive feature in the opening in the dielectric material, to directly contact the front side source/drain conductive contact.

2. The method of claim 1, further comprising recessing the dielectric material after removing the substrate and before the opening in the dielectric material is formed, wherein two side surfaces of two isolation regions are exposed by the recessing.

3. The method of claim 2, further comprising forming a liner on each of the exposed two side surfaces of the two isolation regions.

4. The method of claim 3, wherein the back side conductive feature is in contact with the liner.

5. The method of claim 3, further comprising etching back the dielectric material after forming the liner to form the opening in the dielectric.

6. A method for forming a semiconductor device structure, comprising:
   forming a source/drain region over a substrate;
   forming an interlayer dielectric layer over and adjacent the source/drain region;
   forming a first opening in the interlayer dielectric layer;
   depositing a dielectric material in the first opening;
   forming, from a front side of the dielectric material, a front side source/drain conductive contact over the source/drain region and in the dielectric material;
   flipping over the substrate;
   forming, from a back side of the dielectric material, a second opening in the dielectric material, wherein a side surface of the front side source/drain conductive contact is exposed by the second opening; and
   forming a back side conductive feature in the second opening to directly contact the first source/drain conductive contact.

7. The method of claim 6, further comprising forming a gate electrode layer adjacent the source/drain region.

8. The method of claim 7, wherein the first opening is formed in the gate electrode layer.

9. The method of claim 8, wherein the back side conductive feature is disposed in the dielectric material adjacent the gate electrode layer.

10. The method of claim 6, wherein the conductive contact is disposed adjacent the source/drain region.

11. The method of claim 6, further comprising removing the substrate to expose the back side of the dielectric material and an isolation region.

12. The method of claim 11, further comprising recessing the dielectric material prior to forming the second opening, wherein side surfaces of the isolation region are exposed.

13. The method of claim 12, further comprising forming a liner on the exposed side surfaces of the isolation region.

14. The method of claim 13, wherein the liner has a thickness ranging from about 3 nm to about 10 nm.

15. A method for forming a semiconductor device structure, comprising:
   forming a first source/drain region and a second source/drain region over a substrate;
   forming a gate electrode layer adjacent the first and second source/drain regions;
   forming a first dielectric material between the first and second source/drain regions, wherein the first dielectric material extends through the gate electrode layer;
   forming, from a front side of the first dielectric material, a first front side source/drain conductive contact over the first source/drain region and in the first dielectric material, wherein the first front side source/drain conductive contact comprises a first surface facing the gate electrode layer and a second surface connected to the first surface and facing the second source/drain region;
   flipping over the substrate;
   forming, from a front side of the dielectric material, an opening in the first dielectric material to expose the first front side source/drain conductive contact; and
   forming a first back side conductive feature in the opening in the first dielectric material to directly contact the first front side source/drain conductive contact, the first back side conductive feature is disposed adjacent the second surface of the first front side source/drain conductive contact.

16. The method of claim 15, wherein the first front side source/drain conductive contact further comprises a top surface connected to the first and second surfaces.

17. The method of claim 16, wherein the first back side conductive feature interfaces the top surface, the first surface, and the second surface of the first front side source/drain conductive contact.

18. The method of claim 15, further comprising:
   forming third and fourth source/drain regions adjacent the first source/drain region; and
   forming a second dielectric material between the third and fourth source/drain regions, wherein the second dielectric material extends through the gate electrode layer.

19. The method of claim 18, further comprising forming a second front side source/drain conductive contact over the third and fourth source/drain regions and in the second dielectric material.

20. The method of claim 19, further comprising forming a second back side conductive feature in the second dielectric material, wherein the second back side conductive feature is electrically connected to the second front side source/drain conductive contact.

* * * * *